US007103101B1

(12) United States Patent
Davila

(10) Patent No.: US 7,103,101 B1
(45) Date of Patent: Sep. 5, 2006

(54) METHOD AND SYSTEM FOR BLIND KARHUNEN-LOEVE TRANSFORM CODING

(75) Inventor: Carlos E. Davila, Dallas, TX (US)

(73) Assignee: Southern Methodist University, Dallas, TX (US)

(*) Notice: Subject to any disclaimer, the term of this patent is extended or adjusted under 35 U.S.C. 154(b) by 720 days.

(21) Appl. No.: 09/976,053

(22) Filed: Oct. 15, 2001

Related U.S. Application Data

(60) Provisional application No. 60/239,930, filed on Oct. 13, 2000.

(51) Int. Cl.
*H04B 1/66* (2006.01)
(52) U.S. Cl. .................. 375/240.18; 704/203
(58) Field of Classification Search ............. 375/240, 375/240.01, 240.18, 240.2, 240.22; 704/203, 704/269
See application file for complete search history.

(56) References Cited

U.S. PATENT DOCUMENTS 6,152,883 A * 11/2000 Blanchett et al. ........... 600/521
6,539,103 B1 * 3/2003 Panin et al. ................. 382/131
6,539,366 B1 * 3/2003 Doyle et al. .................. 706/13

OTHER PUBLICATIONS

Vivek K. Goyal, et al., Universal Transform Coding Based On Backward Adaptation, pp. 1-5.
Vivek K. Goyal, et al., Transform Coding with Backward Adaptive Updates, IEEE Transactions on Information Theory, vol. 46, No. 4, Jul. 2000, pp. 1623-1633.
Vivek K. Goyal, et al., Transform Coding Using Adaptive Bases And Quantization, pp. 1-2.

* cited by examiner

*Primary Examiner*—Kevin Kim
(74) *Attorney, Agent, or Firm*—Oblon, Spivak, McClelland, Maier & Neustadt, P.C.

(57) ABSTRACT

A method, system, and computer program product for blind Karhunen-Loeve transform (KLT) coding is disclosed, wherein KLT coefficients and possibly additional information are transmitted without transmitting KLT basis vectors. Instead the KLT basis vectors are estimated at both the transmitter and the receiver. In particular, the KLT transform coefficients are calculated based on an original signal frame, quantized, encoded, and transmitted. The transmitted KLT coefficients are received, decoded, and transformed into a reconstructed original signal frame by the receiver. Exemplary embodiments include a KLT coder in which a search direction vector is initially set to an arbitrary vector, such as a white noise vector, a KLT coder which selects a search direction vector from a set of search direction vectors in a codebook and a KLT coder for an original signal frame with an unknown signal subspace dimension.

29 Claims, 28 Drawing Sheets transmitter $\hat{Q}_0 = I_N(:,1:r)$
$\hat{\Lambda}_0 = I_r$
for $n = 1, 2, \ldots$
    $\bar{Q}_n = [\hat{Q}_{n-1} \; v_n]$
    $y_n = \hat{Q}_{n-1}^T x_n$
    $\bar{y}_n = [y_n^T \; x_n^T v_n]^T$
    $\hat{y}_n = \Delta(\bar{y}_n)$
    transmit $\hat{y}_n$ to receiver
    $F = \gamma \bar{Q}_n^T \hat{Q}_{n-1} \hat{\Lambda}_{n-1} \hat{Q}_{n-1}^T \bar{Q}_n + \hat{y}_n \hat{y}_n^T$
    $G = \bar{Q}_n^T \bar{Q}_n$
    Solve $FW_n = GW_n \Pi_n$ for $W_n, \Pi_n$
    $\hat{Q}_n = \bar{Q}_n W_n(:,1:r)$
    $\hat{\Lambda}_n = \Pi_n(1:r, 1:r)$
end receiver $\hat{Q}_0 = I_N(:,1:r)$
$\hat{\Lambda}_0 = I_r$
for $n = 1, 2, \ldots$
    $\bar{Q}_n = [\hat{Q}_{n-1} \; v_n]$
    wait for $\hat{y}_n$
    $\hat{x}_n = \hat{Q}_{n-1} \hat{y}_n(1:r)$
    $F = \gamma \bar{Q}_n^T \hat{Q}_{n-1} \hat{\Lambda}_{n-1} \hat{Q}_{n-1}^T \bar{Q}_n + \hat{y}_n \hat{y}_n^T$
    $G = \bar{Q}_n^T \bar{Q}_n$
    Solve $FW_n = GW_n \Pi_n$ for $W_n, \Pi_n$
    $\hat{Q}_n = \bar{Q}_n W_n(:,1:r)$
    $\hat{\Lambda}_n = \Pi_n(1:r, 1:r)$
end

Figure 2c

Figure 4C transmitter

$\hat{Q}_0 = I_N(:,1:r)$
$\hat{\Lambda}_0 = I_r$
for $n = 1, 2, \ldots$
   $T_{max} = 0$
   for $m = 1, \ldots, M$
     $v_n = V(:,m)$
     $\bar{Q} = [\hat{Q}_{n-1} \; v_n]$
     $y_n = \hat{Q}_{n-1}^T x_n$
     $\tilde{y}_n = [y_n^T \; x_n^T v_n]^T$
     $\hat{y}_n = \Delta(\tilde{y}_n)$
     $F = \gamma \bar{Q}^T \hat{Q}_{n-1} \hat{\Lambda}_{n-1} \hat{Q}_{n-1}^T \bar{Q}_n + \hat{y}_n \hat{y}_n^T$
     $G = \bar{Q}_n^T \bar{Q}_n$
     Solve $FW_n = GW_n \Pi_n$ for $W_n, \Pi_n$
     $\hat{Q}_n = \bar{Q}_n W_n(:,1:r)$
     $\hat{\Lambda}_n = \Pi_n(1:r,1:r)$
     $T = \text{trace}(\Pi_n(1:r,1:r))$
     if $T > T_{max}$
       $T_{max} = T$
       $m_0 = m$
       $\hat{y}_n^* = \hat{y}_n$
     end
   end
   $\hat{y}_n = \hat{y}_n^*$
   transmit $\hat{y}_n, m_0$ to receiver
end receiver

$\hat{Q}_0 = I_N(:,1:r)$
$\hat{\Lambda}_0 = I_r$
for $n = 1, 2, \ldots$
   wait for $\hat{y}_n, m_0$
   $\hat{x}_n = \hat{Q}_{n-1} \hat{y}_n(1:r)$
   $v_n = V(:,m_0)$
   $\bar{Q}_n = [\hat{Q}_{n-1} \; v_n]$
   $F = \gamma \bar{Q}_n^T \hat{Q}_{n-1} \hat{\Lambda}_{n-1} \hat{Q}_{n-1}^T \bar{Q}_n + \hat{y}_n \hat{y}_n^T$
   $G = \bar{Q}_n^T \bar{Q}_n$
   solve $FW_n = GW_n \Pi_n$ for $W_n, \Pi_n$
   $\hat{Q}_n = \bar{Q}_n W_n(:,1:r)$
   $\hat{\Lambda}_n = \Pi_n(1:r,1:r)$
end

```
transmitter                              receiver

Q̂₀ = I_N                                 Q̂₀ = I_N
Λ̂₀ = I_N                                 Λ̂₀ = I_N
for n=1,2,...                            for n=1,2,...
    yₙ = Q̂ᵀₙ₋₁ xₙ                            wait for ŷₙ(1:r_opt), r_opt
    ŷₙ = Δ(yₙ)                               x̂ₙ = Q̂ₙ₋₁(:,1:r_opt) ŷₙ(1:r_opt)
    ρ=1                                      H = γΛ̂ₙ₋₁ + ŷₙŷₙᵀ
    k=1                                      solve HQ̂ₙ = Q̂ₙΛ̂ₙ for Q̂ₙ,Λ̂ₙ
    while ρ > MSE_max                    end
        x̂ₙ = Q̂ₙ₋₁(:,1:k) ŷₙ(1:k);
        ρ = ‖x̂ₙ - xₙ‖² / ‖xₙ‖²
        k = k+1
        if k=N+1 and ρ>MSE_max
            orthonormalize columns of Q̂ₙ
            k=1
            yₙ = Q̂ᵀₙ₋₁ xₙ
            ŷₙ = Δ(yₙ)
        end
    end
    r_opt = k-1
    transmit ŷₙ(1:r_opt), r_opt to receiver
    H = γΛ̂ₙ₋₁ + ŷₙŷₙᵀ
    solve HQ̂ₙ = Q̂ₙΛ̂ₙ for Q̂ₙ,Λ̂ₙ
end
```

Figure 6C

Figure 8C transmitter

$\hat{Q}_0 = I_N$
$\hat{x}_0 = 0$
$\hat{R}_0 = \beta I_N$
for $n = 1, 2, \ldots$
    $y_n = \hat{Q}_{n-1}^T x_n$
    $\hat{y}_n = \Delta(y_n)$
    $\rho = 1, K = 1, b = 0$
    while $\rho > MSE_{max}$ and $b < 2$
        $\hat{x}_n = \hat{Q}_{n-1}(:, 1:K) \hat{y}_n(1:K)$
        $\rho = \|\hat{x}_n - x_n\|^2$
        $K = K + 1$
        if $K = N+1$ and $\rho > MSE_{max}$
            use alternative bit allocation
            $b = b + 1, K = 1$
            $y_n = \hat{Q}_{n-1}^T x_n$
            $\hat{y}_n = \Delta(y_n)$
        end
    end
    if $b \neq 2$, $r_{opt} = K-1$
    if $b = 2$
        $r_{opt} = N$
        reduce $r_{opt}$ until $\hat{y}_n(r_{opt}) \neq 0$
    end
    transmit $\hat{y}_n(1:r_{opt}), r_{opt}, b$ to receiver
    $w_n = [\hat{x}_{n-1}^T \; \hat{x}_n^T]^T$
    $\hat{R}_{n-1, 0} = \hat{R}_{n-1}$
    for $m = 1 \ldots N$
        $z = w_n(m+1 : m+N)$
        $\hat{R}_{n-1, m} = \gamma \hat{R}_{n-1, m-1} + z z^T$
    end
    $\hat{R}_n = \hat{R}_{n-1, N}$
    solve $\hat{R}_n \hat{Q}_n = \hat{Q}_n \hat{\Lambda}_n$ for $\hat{Q}_n, \hat{\Lambda}_n$
end receiver

$\hat{Q}_0 = I_N$
$\hat{x}_0 = 0$
$\hat{R}_0 = \beta I_N$
for $n = 1, 2, \ldots$
    wait for $\hat{y}_n, r_{opt}$, and $b$
    if $b \neq 0$, use alternative bit allocation
    $\hat{x}_n = \hat{Q}_{n-1} \hat{y}_n$
    $w_n = [\hat{x}_{n-1}^T \; \hat{x}_n^T]^T$
    $\hat{R}_{n-1, 0} = \hat{R}_{n-1}$
    for $m = 1 : N$
        $z = w_n(m+1 : m+N)$
        $\hat{R}_{n-1, m} = \gamma \hat{R}_{n-1, m-1} + z z^T$
    end
    $\hat{R}_n = \hat{R}_{n-1, N}$
    solve $\hat{R}_n \hat{Q}_n = \hat{Q}_n \hat{\Lambda}_n$ for $\hat{Q}_n, \hat{\Lambda}_n$
end transmitter

$Q_0 = I_N$
$R_0 = \beta I_N$
for $n = 1, 2, \ldots$
    $R_n = \gamma R_{n-1} + x_n x_n^T$
    Solve $R_n Q_n = Q_n \Lambda_n$ for $Q_n, \Lambda_n$
    $y_n = Q_n^T x_n$
    $\rho = 1$
    $k = 1$
    while $\rho > MSE_{max}$
        $\hat{x}_n = Q_n(:, 1:k) y_n(1:k)$
        $\rho = \|\hat{x}_n - x_n\|^2 / \|x_n\|^2$
        $k = k + 1$
    end
    $r_{opt} = k - 1$
    $\hat{y}_n = \Delta(y_n)$
    transmit $\hat{y}_n, r_{opt}$ to receiver
end receiver

$\hat{Q}_0 = I_N$
$\hat{R}_0 = \beta I_N$
for $n = 1, 2, \ldots$
    wait for $\hat{y}_n, r_{opt}$
    $\alpha = 1/M$
    for $m = 1, \ldots, M$
        $\epsilon = \epsilon_{max} + 1$
        while $\epsilon > \epsilon_{max}$
            $\hat{x}_n = \hat{Q}_{n-1}(:, 1:r_{opt}) \hat{y}_n(1:r_{opt})$
            if $m = 1$
                $\hat{R}_n = \gamma \hat{R}_{n-1} + \alpha \hat{x}_n \hat{x}_n^T$
            else
                $\hat{R}_n = \hat{R}_n + \alpha \hat{x}_n \hat{x}_n^T$
            end
            Solve $\hat{R}_n \hat{Q}_n = \hat{Q}_n \hat{\Lambda}_n$ for $\hat{Q}_n, \hat{\Lambda}$
            $\epsilon = \|\hat{Q}_n - \hat{Q}_{n-1}\|$
            $\hat{Q}_{n-1} = \hat{Q}_n$
        end
    end
end

Figure 10c

METHOD AND SYSTEM FOR BLIND KARHUNEN-LOEVE TRANSFORM CODING

CROSS-REFERENCE TO CO-PENDING APPLICATIONS

The present application is related to and claims priority to U.S. Provisional Application Ser. No. 60/239,930, filed Oct. 13, 2000. The contents of that application are incorporated herein by reference.

BACKGROUND OF THE INVENTION

1. Field of the Invention

The present invention relates to the field of signal coding, and more specifically to Karhunen-Loeve transform coding.

2. Discussion of the Background

Transform coding is a known technology for coding signals. FIG. 1 shows a block diagram of a conventional transform coder, including a transmitter 10 and a receiver 11. At the transmitter 10, an original discrete-time signal frame $x_n$ is transformed by a transformer 100 into transform coefficients $y_n$. Each signal frame $x_n$, for n=1, 2, 3, ... is generally comprised of a continuous segment of length N of a discrete-time signal x(k) and can be defined, for example, as $x_n = [x(nN-1) x(nN-2) ... x(N(n-1))]$. Further, the segments of the signal x(k) defining the signal frames $x_n$ can overlap up to N−1 elements or be totally non-overlapping.

The transformation preferably decorrelates the original signal frame and compacts a large fraction of the signal energy, i.e. variance, into relatively fewer transform coefficients. This is known as an energy-packing property. Because of this property, it is possible to retain a fraction of the transform coefficients without seriously affecting the reconstructed signal quality. The transform coefficients are quantized at the quantizer 110 to yield the quantized transform coefficients $\hat{y}_n$. As a result of quantization and the possible elimination of redundant transform coefficients, the quantized signal $\hat{y}_n$ that is encoded by the encoder 120 may contain significantly less than the N elements in the original signal frame $x_n$. The encoded signal is then sent along the channel.

At the receiver 11, the encoded signal is received through the channel into the decoder 130. The signal is decoded, yielding the quantized transform coefficients $\hat{y}_n$. The original signal frame is reconstructed at the inverse transformer 140 to produce the reconstructed signal frame $\hat{x}_n$. Because the transform coefficients were quantized and some redundant or insignificant transform coefficients were possibly eliminated prior to encoding, the reconstructed signal frame $\hat{x}_n$ is generally slightly different from the original signal frame $x_n$.

The Karhunen-Loeve transform (KLT) is known to be the optimum transform for signal compression because the KLT exhibits a significant energy-packing property. In other words, a larger fraction of the total energy or variance of the signal frame is contained in the first few coefficients, as compared to other transforms. Therefore, the number of transform coefficients retained, quantized, and encoded can be significantly less than other transforms. As a result, the signal bit rate during transmission is reduced while the signal quality is maintained. More details concerning the KLT are found in *Digital Coding of Waveforms*, by N. Jayant and P. Noll, 1984, the entire contents thereof incorporated herein by reference. Additional information about KLT may also be found in (1) C. E. Davila, "Blind Adaptive Estimation of KLT Basis Vectors", *Transactions on Signal Processing*, Vol. 49, No. 7, pgs. 1364–1369, July, 2001; (2) C. E. Davila, "Blind KLT Coding," *Proc. 2000 IEEE Signal Processing Workshop*, Hunt, Tex., Oct. 15–18, 2000 (the proceedings of which are available via HTTP at "spib.rice.edu/SPTM/DSP2000/submission/DSP/papers/paper153/paper153.pdf"); and (3) C. E. Davila, "Blind Adaptive Estimation of KLT Basis Vectors," Proc. IEEE International Conference on Acoustics, Speech, and Signal Processing, Istanbul, Jun. 5–9, 2000. The contents of those papers are incorporated herein by reference.

In the transformer 100, the KLT transform coefficients $y_n$ are determined by applying a KLT transform matrix Q to the original signal $x_n$, as shown in Equation (1), $$y_n = Q x_n. \tag{1}$$

The net effect of the transformation is to establish a new coordinate system whose origin is at the centroid of the population of the original signal frame $x_n$ and whose axes are in the direction of the eigenvectors of the autocorrelation matrix R of the original signal frame $x_n$. The eigenvalues are the variances, i.e., original signal energy, of the KLT transform coefficients $y_n$ along the eigenvectors. The eigenvectors form the column vectors of the transform matrix Q, and are also referred to as KLT basis vectors.

Unfortunately, the KLT basis vectors are data-dependent, i.e., they require an estimate of the autocorrelation matrix of the original signal frame $x_n$ for their computation. Hence, in order to reconstruct the original signal frame at the receiver 11, the KLT basis vectors must also be encoded with the KLT transform coefficients and transmitted to the receiver. The necessity of transmitting the KLT basis vectors reduces signal compression and leads to increased bit rates. For this reason, the KLT has had limited use in signal coding algorithms.

SUMMARY OF THE INVENTION

Accordingly, one object of the present invention is to provide a method and system to use the Karhunen-Loeve transform to encode, transmit, and accurately reconstruct a signal frame without suffering a reduction in signal compression or increased bit rates.

A further object of the present invention is provide a method and system to encode and transmit KLT coefficients, without having to encode and transmit KLT basis vectors.

Another object of the present invention is to estimate basis vectors from the KLT transform coefficients at the receiver.

Another object of the present invention is to provide a method and system to reconstruct the original signal frame using the estimated KLT basis vectors at the receiver.

These and other objects are accomplished by way of a KLT coding method, system, and computer program product constructed according to the present invention, wherein the KLT transform coefficients of an original signal frame are calculated at a transmitter, the KLT coefficients are transmitted to a receiver, KLT basis vectors of the original signal are estimated at the transmitter and the receiver based on the KLT transform coefficients, and the original signal frame is reconstructed at the receiver from the estimated KLT basis vectors, thereby performing "blind" KLT coding. This is called "blind" KLT coding because the receiver estimates the KLT basis vectors without explicit knowledge of the original signal frame $x_n$.

Thus, according to the "blind" KLT coding of the present invention, the KLT transform coefficients are encoded and transmitted, without the corresponding KLT basis vectors, to a receiver, at which the signal frame is successfully reconstructed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2C is an exemplary algorithm of the first embodiment of the invention in which the KLT basis vectors are estimated from the transform coefficients;

FIG. 4C is an exemplary algorithm of the second embodiment of the invention in which the KLT basis vectors are estimated based on the transform coefficients and a codebook index;

FIG. 6C is an exemplary algorithm of the third embodiment of the invention in which the KLT basis vectors are estimated based on the transform coefficients and the number of KLT transform coefficients;

FIG. 8C is an exemplary algorithm of the fourth embodiment of the invention in which the KLT basis vectors are estimated based on the transform coefficients, the number of KLT coefficients, and the number of bits per coefficient;

FIG. 10C is an exemplary algorithm of the fifth embodiment of the invention.

DETAILED DESCRIPTION OF THE PREFERRED EMBODIMENTS

Figure 1:
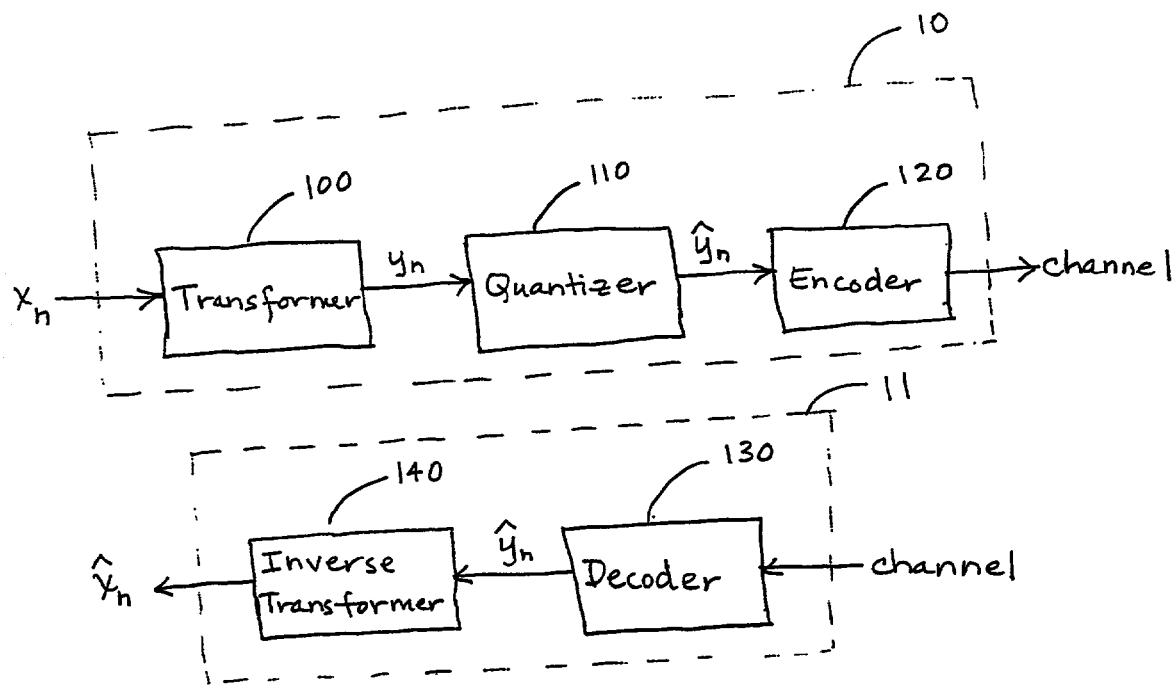
FIG. 1 is a block diagram of a conventional transform coder which transforms, quantizes, and encodes an original signal at a transmitter and which receives, decodes, inversely transforms the transmitted signal at a receiver.

Referring now to the drawings, wherein like reference numerals designate identical or corresponding parts throughout the several views.

Estimation of the KLT basis vectors can be accomplished by estimating the autocorrelation matrix $\hat{R}_n$ of an original signal frame $x_n$, updating that estimate $\hat{R}_n$ each time a new signal frame is obtained, and estimating the eigenvectors and eigenvalues of the autocorrelation matrix $\hat{R}_n$. Recall that the eigenvectors of the autocorrelation matrix are the KLT basis vectors arranged in transform matrix Q, such that the estimated KLT eigenvector and corresponding KLT eigenvalue matrices of $\hat{R}_n$ are $\hat{Q}_n$ and $\Lambda_n$, respectively. The estimation process is iterative such that the KLT basis vectors estimated for a current signal frame $x_n$ can be used to calculate the KLT transform coefficients of the next signal frame $x_{n+1}$. Then, the KLT basis vectors are estimated for the next signal frame $x_{n+1}$ and used to calculate the KLT transform coefficients of the signal frame $x_{n+2}$, and so forth.

The transmitter and the receiver of the present invention both estimate the KLT basis vectors, i.e., matrix $\hat{Q}_n$. The transmitter calculates the KLT transform coefficients $y_n$ based on the previously estimated KLT basis vectors, matrix $\hat{Q}_{n-1}$, and transmits these KLT transform coefficients to the receiver. The receiver then reconstructs the original signal frame from these KLT transform coefficients $y_n$ by multiplying the KLT transform coefficients by the inverse of the estimated KLT basis vectors, matrix $\hat{Q}_{n-1}$. As such, the KLT basis vectors at the transmitter and the receiver are the same. This feature allows the present invention to transmit the KLT coefficients without the corresponding KLT basis vectors.

Figure 2A:
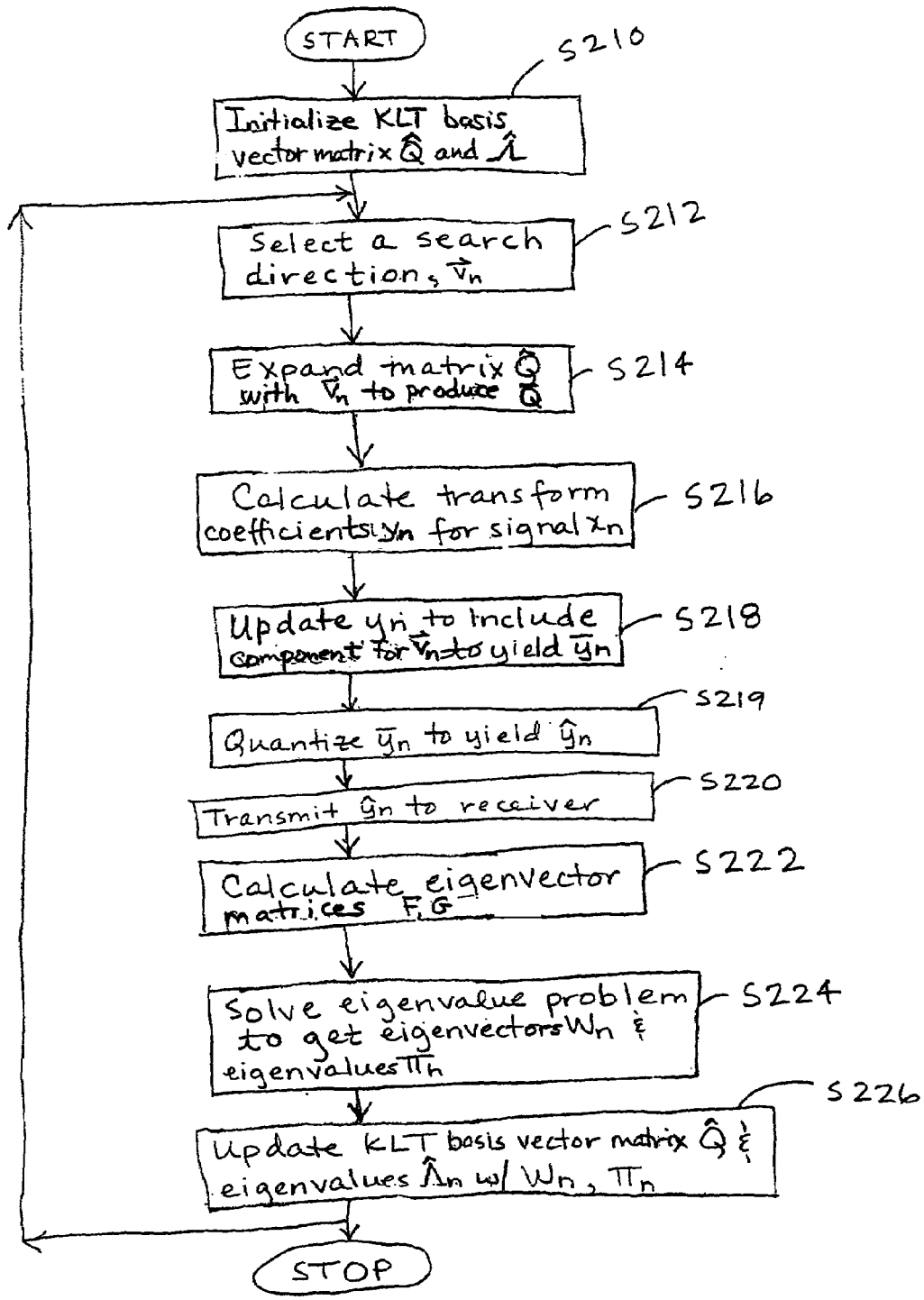
FIG. 2A is a flowchart of the steps performed at the transmitter in a first embodiment of the invention in which the KLT basis vectors are estimated from the transform coefficients.
Figure 2B:
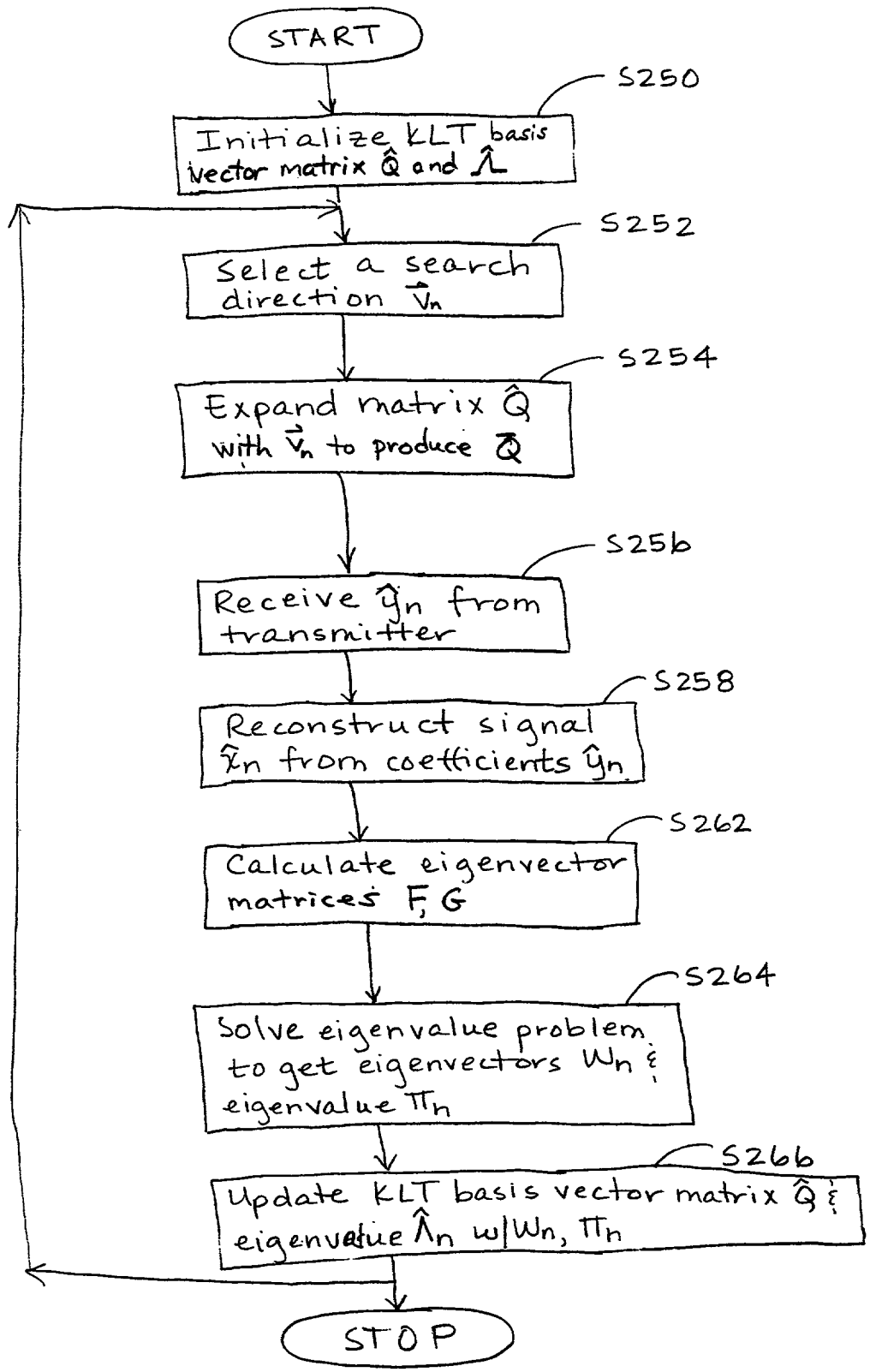
FIG. 2B is a flowchart of the steps performed at the receiver in the first embodiment of the invention in which the KLT basis vectors are estimated from the transform coefficients.

FIGS. 2A–2C show a first embodiment of the method of KLT coding of the present invention in which the KLT coefficients are transmitted to the receiver in order to reconstruct the original signal frame.

FIG. 2A shows the steps performed at the transmitter in the method of the first embodiment. In step S210, the KLT basis vector matrix $\hat{Q}$, is initialized to the first r columns of an N by N identity matrix and the KLT eigenvalue matrix $\Lambda$ is initialized to an r by r identity matrix. The integer r is a predetermined positive integer. Note that the KLT basis vectors are initialized to orthonormal vectors.

In step S212, a search direction vector $\vec{v}_n$ is selected. The search direction represents a direction in space to be searched in order to eventually reach the true KLT basis vectors of the original signal frame. In this embodiment, the search direction vector $\vec{v}_n$ is set to a white noise vector, for example.

In step S214, the KLT basis vector matrix $\hat{Q}_n$ is expanded accordingly to include the search direction vector $\vec{v}_n$ to produce $\overline{Q}_n$. In step S216, the transform coefficients $y_n$ are calculated from the previously estimated basis vector matrix $\hat{Q}_{n-1}$, prior to expansion, and the original signal frame $x_n$ according to Equation (2):

$$y_n = \hat{Q}_{n-1}^T x_n \qquad (2)$$

In step S218, the transform coefficients are updated to include a scalar component corresponding to the search direction vector $\vec{v}$ to produce $\overline{y}_n$.

In step S219, the updated transform coefficients $\overline{y}_n$ are quantized to produce $\hat{y}_n$.

In step S220, the updated transform coefficients $\hat{y}_n$ are transmitted to the receiver. Note that he number of bits allocated to encode each KLT transform coefficient may be predetermined or calculated using, for example, the optimal scheme given by Equation (9). Moreover, additional optional information may be transmitted to the receiver along with the KLT transform coefficients and this information may include data regarding the bit allocation scheme.

In step S222, the matrices F and G are calculated. F is an updated estimate of the autocorrelation matrix, where $\hat{Q}_{n-1}$ is the previously estimated KLT basis vector matrix and $\hat{\Lambda}_{n-1}$ is the corresponding KLT eigenvalue matrix. Equation (3a) is a calculation of F:

$$F = \gamma \overline{Q}_n^T \hat{Q}_{n-1} \hat{\Lambda}_{n-1} \hat{Q}_{n-1}^T \overline{Q}_n + \hat{y}_n \hat{y}_n^T \qquad (3a)$$

in which $\gamma$ is a constant between 0 and 1, $\overline{Q}_n$ is the expanded KLT basis vectors matrix from step S214, and $y_n$ are the quantized KLT transform coefficients. G is an associated matrix calculated according to Equation (3b):

$$G = \overline{Q}_n^T \overline{Q}_n. \qquad (3b)$$

After F and G are calculated, they define the generalized eigenvalue problem shown in Equation (4):

$$FW =_n GW_n \Pi_n \qquad (4)$$

in which $W_n$ and $\Pi_n$ are the respective updated eigenvectors and eigenvalues of the autocorrelation matrix.

In step S224, using standard techniques, the generalized eigenvalues problem is solved for $W_n$ and $\Pi_n$. Details of standard techniques are described in *Matrix Computations* by Golub and Van Loan, 1989, the entire contents thereof incorporated herein by reference.

In step S226, the KLT basis vector matrix and the corresponding eigenvalue matrix are updated using $W_n$ and $\Pi_n$. Hence, the KLT basis vectors are estimated at the transmitter.

Steps S212–S226 are repeated for all additional signal frames.

FIG. 2B shows the steps performed at the receiver in the method of the first embodiment. In step S250, the KLT basis vector matrix $\hat{Q}$ is initialized to the first r columns of an N by N identity matrix and the KLT eigenvalue matrix $\hat{\Lambda}$ is initialized to an r by r identity matrix. The integer r is the same predetermined positive integer used by the transmitter.

In step S252, a search direction vector $\vec{v}_n$ is selected. The search direction vector of the transmitter and the receiver are the same.

In step S254, the basis vector matrix $\hat{Q}_n$ is expanded accordingly to include the search direction vector $\vec{v}_n$ to produce $\overline{Q}_n$.

In step S256, the transform coefficients $\hat{y}_n$ are received from the transmitter. Note that additional optional information may also be received at this step, including information regarding the bit allocation scheme used to encode the KLT transform coefficients.

In step S258, the reconstructed signal $\hat{x}_n$ is found according to Equation (5a):

$$\hat{x}_n = \hat{Q}_{n-1} \hat{y}_n(1:r) \qquad (5a)$$

in which $y_n$ are transform coefficients and $\hat{Q}_{n-1}$ is the previously estimated KLT basis vector matrix, prior to expansion.

Steps S262–S266 are similar to the steps S222–S226 performed by the transmitter to estimate the KLT basis vectors. As such, the receiver can estimate the KLT basis vectors and reach the same estimate as the transmitter. Thus the receiver can estimate the KLT basis vectors and use them to reconstruct the original signal successfully without having received the basis vectors from the transmitter.

Steps S252–S266 are repeated for all additional signal frames.

FIG. 2C shows an exemplary algorithm for performing KLT coding in the first embodiment.

Figure 3:
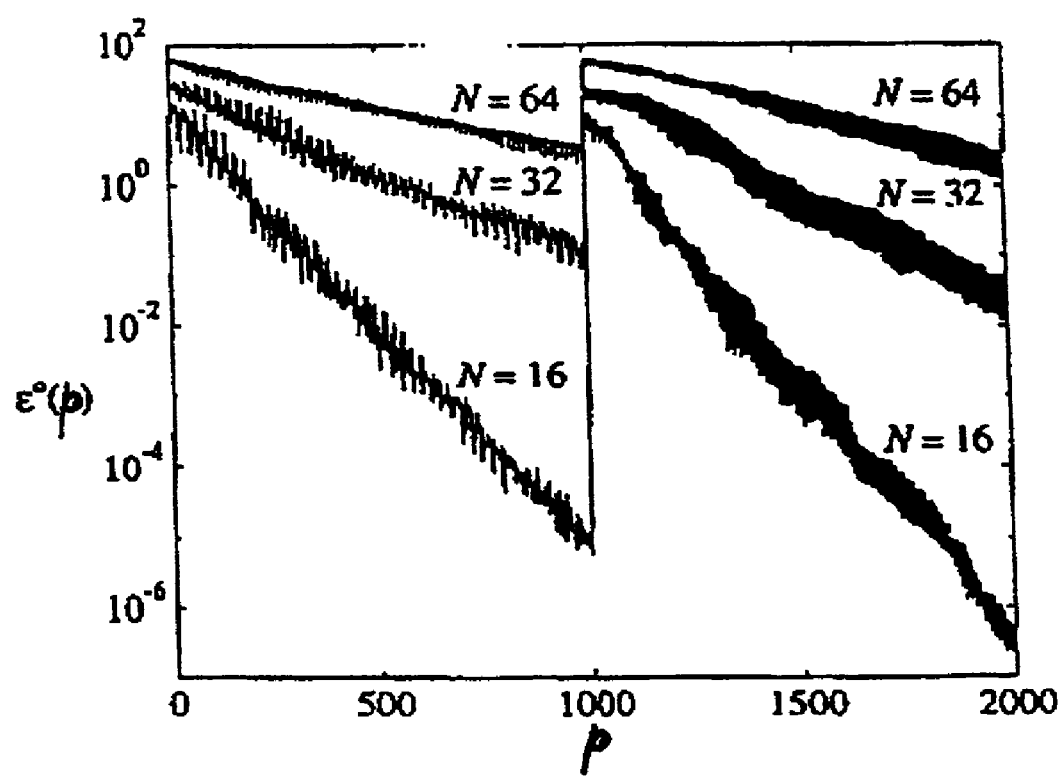
FIG. 3 is a graph showing an exemplary result of the first embodiment of FIGS. 2A–2C.

FIG. 3 is a graph showing an exemplary result of the first embodiment of the present invention. A signal x(n) is defined as $$x(n) = \begin{cases} \cos(0.35\pi n) + \cos(0.78\pi n + 0.35\pi), n = 1, \ldots, 999 \\ \cos(0.6\pi n) + \cos(0.8\pi n + 0.35\pi), n = 1000, \ldots, 2000 \end{cases} \qquad (5a)$$

The mean squared error, defined in Equation (5b), $$\epsilon^0(n) = \|\hat{x}_n - x_n\|^2 \qquad (5b)$$

is an estimate of the difference between the original signal frame and the reconstructed signal frame, for different signal frame lengths N. Note that for this result, each signal frame $x$, is defined with the maximum possible overlap of N−1 signal elements. The results in FIG. 3 show that the mean squared error is very low initially and continues to decrease as n increases. At n=1000, $\epsilon^0(n)$ increases because the signal pattern changes. However, the error is still low and decreasing. Thus, the reconstructed signal is very close to the original signal.

Figure 4A:
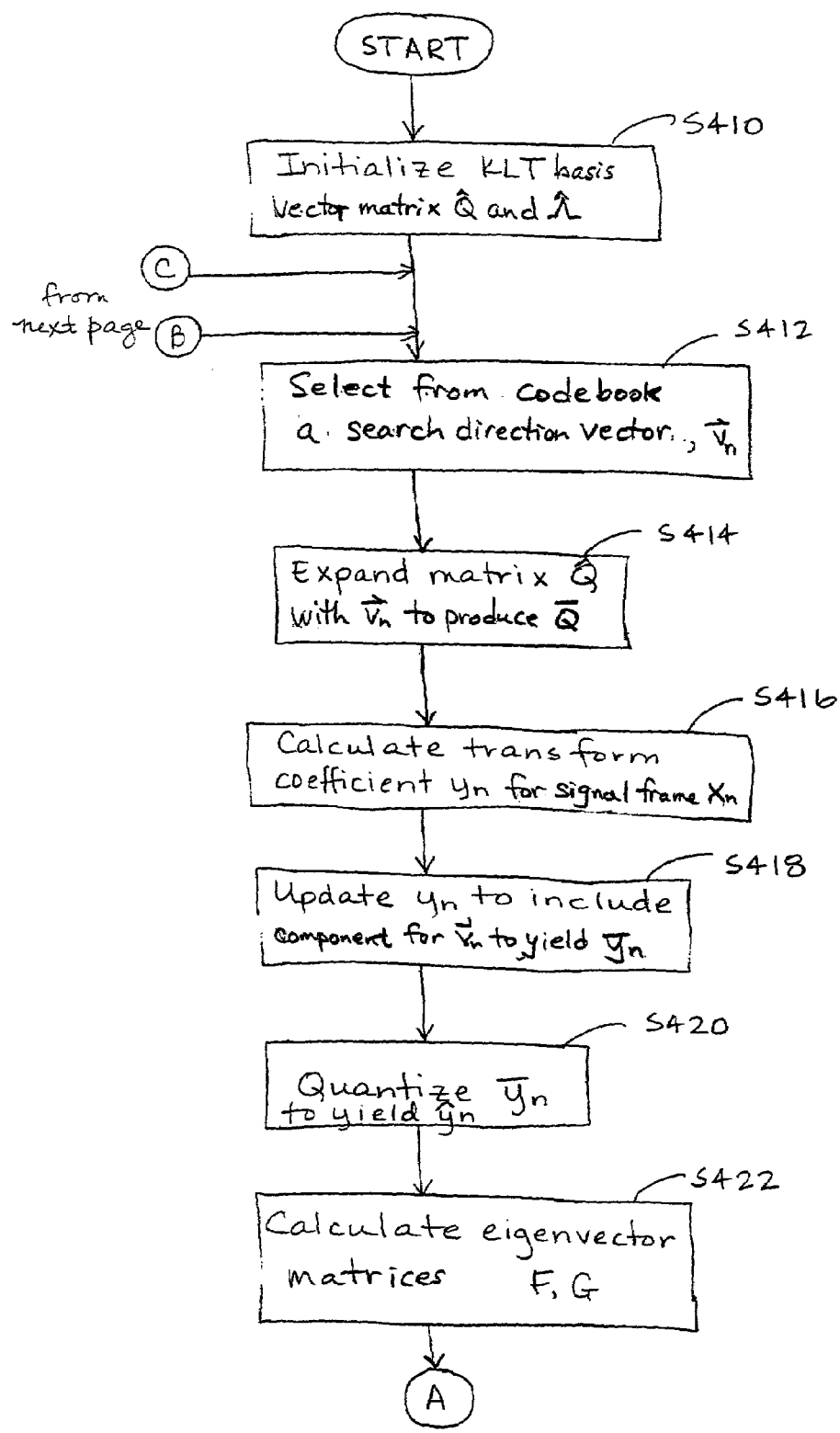
FIG. 4A is a flowchart of the steps performed at the transmitter in a second embodiment of the invention in which the KLT basis vectors are estimated based on the transform coefficients and a codebook index.
Figure 4A:
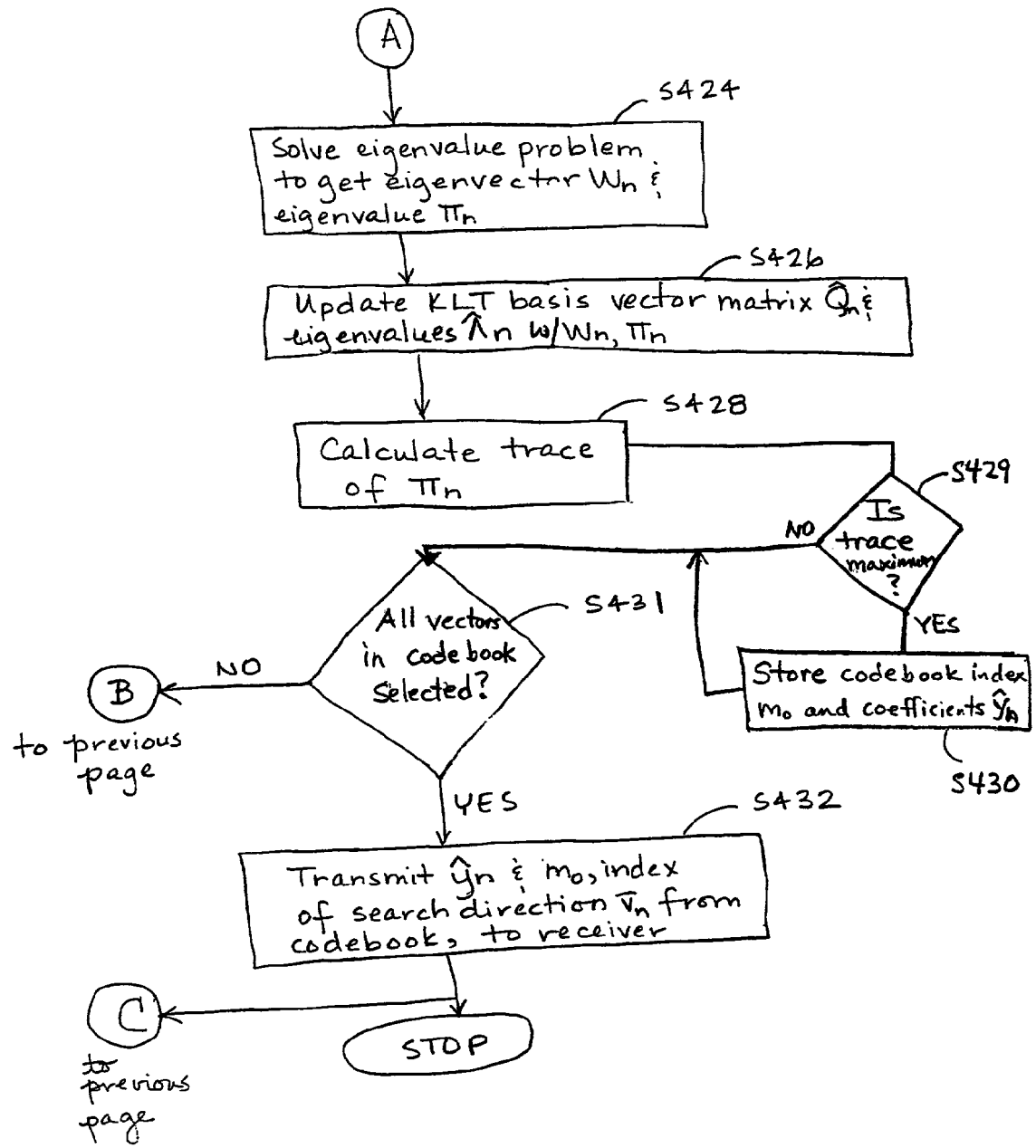
Figure 4B:
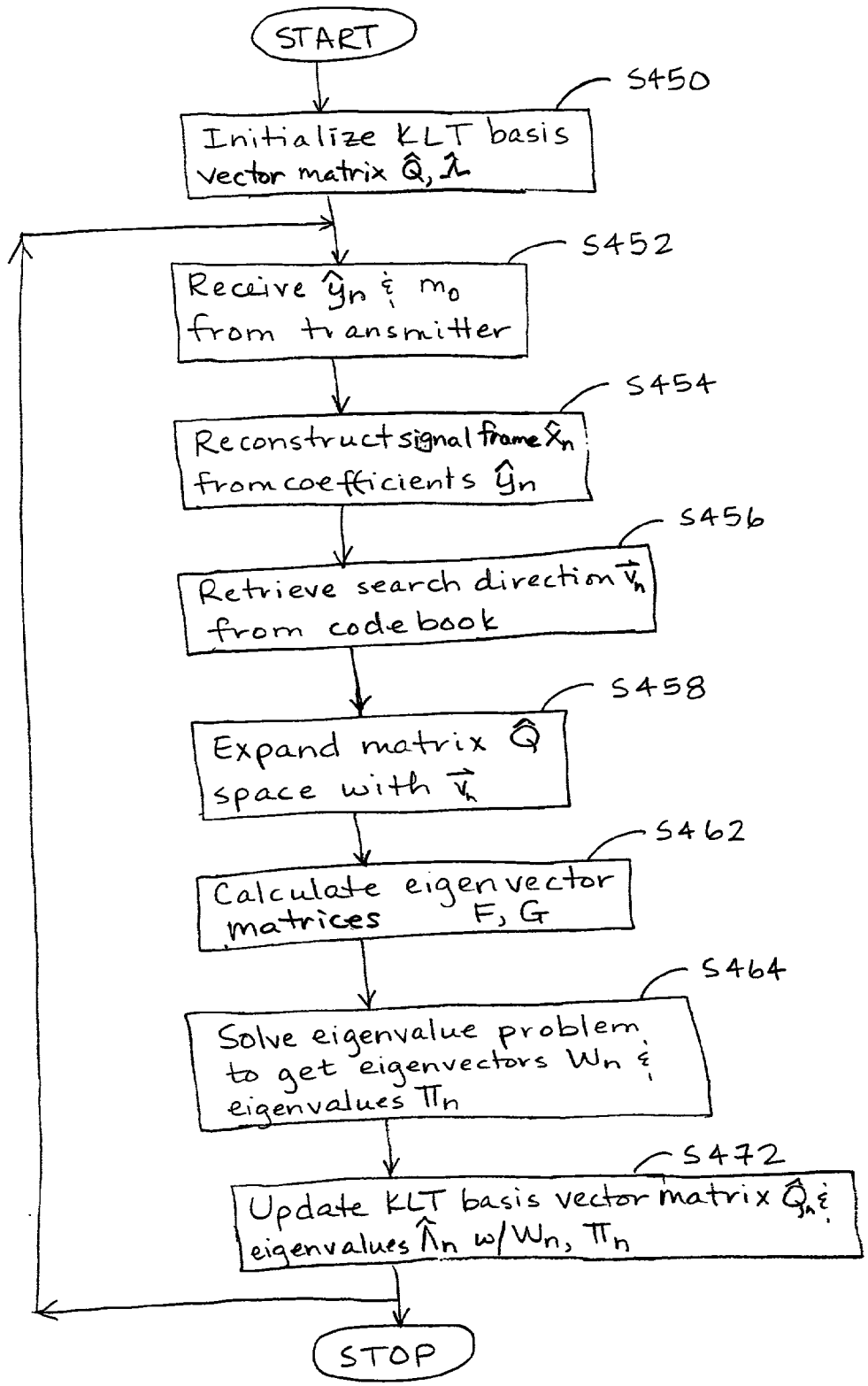
FIG. 4B is a flowchart of the steps performed at the receiver in the second embodiment of the invention in which the KLT basis vectors are estimated based on the transform coefficients and a codebook index.

FIGS. 4A–4C show a second embodiment of the method of KLT coding of the present invention. In this embodiment, an optimal search direction vector is found from a predetermined set of possible search directions. The optimal search direction vector is the one that maximizes the trace of the eigenvalue matrix $\Pi_n$. The trace of the eigenvalue matrix indicates the magnitude of the eigenvalues. The trace should be maximized as an indication that the total energy of the eigenvalues is relatively large. Large eigenvalues indicate a good selection for the Q matrix and a good decorrelation of the original signal frame in obtaining the KLT transform coefficients. Instead of setting the search direction vector to, for example, a white noise vector as in the previous embodiment, an identical list or codebook of candidate search direction vectors is stored at both the transmitter and receiver.

FIG. 4A shows the steps performed at the transmitter in the method of the second embodiment. In step S410, the KLT basis vector matrix $\hat{Q}$, is initialized to the first r columns of an N by N identity matrix and the KLT eigenvalue matrix $\hat{\Lambda}$ is initialized to an r by r identity matrix. The integer r is a predetermined positive integer. Note that the KLT basis vectors are initialized to orthonormal vectors.

In step S412, a search direction vector $\vec{v}_n$ is selected from the codebook. The order of the selection may be random, sequential, or based on some specific ordering.

In step S414, the basis vector matrix $\hat{Q}_n$ is expanded accordingly to include the search direction vector to produce $\overline{Q}_n$.

In step S416, the transform coefficients $y_n$ are calculated from the previously estimated basis vector matrix $\hat{Q}_{n-1}$, prior to expansion, and the original signal $x_n$ according to Equation (2).

In step S418, the transform coefficients are updated to include a scalar component corresponding to the search direction vector $\vec{v}_n$ to produce $\hat{y}_n$.

In step S420, the updated transform coefficients $\overline{y}_n$ are quantized to produce $\hat{y}_n$.

In step S422, eigenvector matrices F and G are calculated, as in Equations (3a) and (3b).

In step S424, following Equation (4), using standard techniques, the generalized eigenvalues problem is solved for $W_n$ and $\Pi_n$.

In step S426, the KLT basis vector matrix and the corresponding eigenvalues are updated using $W_n$ and $\Pi_n$.

In step S428, the trace of $\Pi_n$ is calculated.

In step S429, an inquiry is made whether the calculated trace is greater than a given value. If the trace is not greater than the given value, then step S431 is performed. However, if the trace is greater than the given value, then, in step S430, the calculated trace becomes the given value, the index of the search direction vector in the codebook is stored, the corresponding KLT coefficients are stored, and step S431 is performed.

In step S431, an inquiry is made whether all search vectors in the codebook have been selected. If not, steps S412–S429 are performed. Otherwise, step S432 is performed.

In step S432, both the quantized transform coefficients $\hat{y}_n$ and the codebook index $m_o$ of the search direction vector corresponding to the maximum calculated trace are transmitted to the receiver. Note that he number of bits allocated to encode each KLT transform coefficient may be predetermined or calculated using, for example, the optimal scheme given by Equation (9). Moreover, additional optional information may be transmitted to the receiver along with the KLT transform coefficients and this information may include data regarding the bit allocation scheme.

Steps S412–S432 are repeated for all additional signal frames.

FIG. 4B shows the steps performed at the receiver in the method of the second embodiment. In step S450, the KLT basis vector matrix $\hat{Q}$ is initialized to the first r columns of an N by N identity matrix and the KLT eigenvalue matrix $\hat{\Lambda}$ is initialized to an r by r identity matrix. The integer r is the same predetermined positive integer used by the transmitter.

In step S452, the quantized transform coefficients $\hat{y}_n$ and the codebook index $m_o$ are received from the transmitter. Note that additional optional information may also be received at this step, including information regarding the bit allocation scheme used to encode the KLT transform coefficients.

In step S454, the reconstructed signal $\hat{x}_n$ is found from Equation (5).

In step S456, the optimum search direction vector $\vec{v}_n$ is retrieved from the codebook. Recall that the codebooks of the transmitter and the receiver are the same.

In step S458, the basis vector matrix $\vec{Q}_n$ is expanded accordingly to include the optimum search direction vector to produce $\overline{Q}_n$.

Steps S462–S472 are similar to steps S422–S426 performed by the transmitter to estimate the KLT basis vectors. As such, the receiver can estimate the KLT basis vectors and reach the same estimate as the transmitter. Thus the receiver can estimate the KLT basis vectors and use them to reconstruct the original signal frame successfully without having received the KLT basis vectors from the transmitter.

Steps S452–472 are repeated for all additional signal frames.

FIG. 4C shows an exemplary algorithm for performing KLT coding in the second embodiment.

Figure 5:
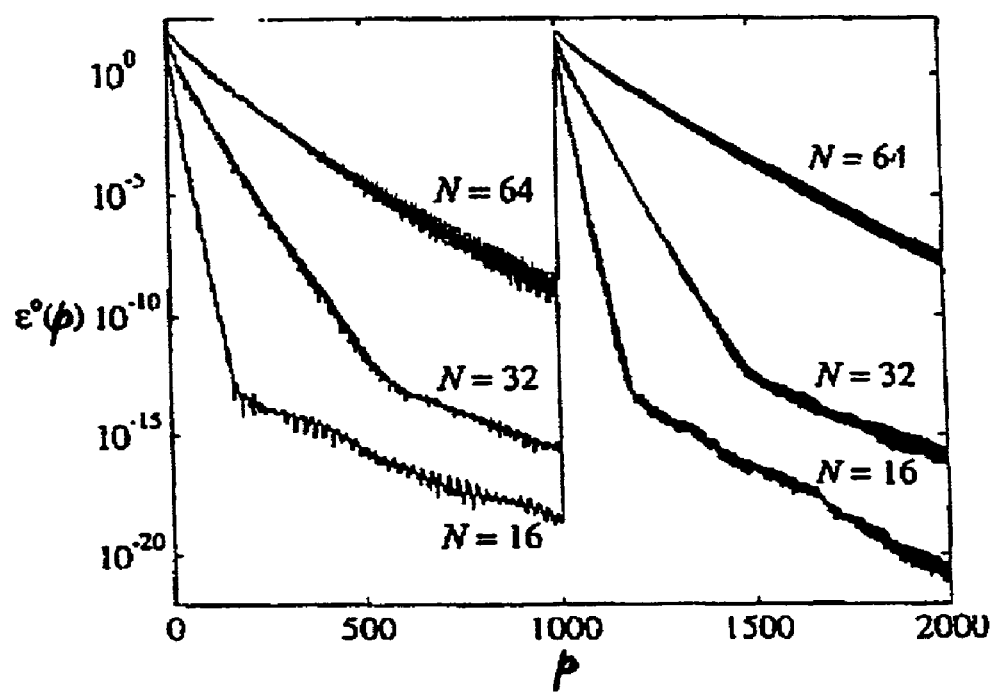
FIG. 5 is a graph showing an exemplary result of the second embodiment of FIGS. 4A–4C.

FIG. 5 is a graph showing an exemplary result of the second embodiment of the present invention. Similar to FIG. 3, the mean squared error $\epsilon_0(n)$ for different signal frame lengths N is shown as a function of n for the signal defined in Equation (5a). In this case, the mean squared error decreases rapidly because the optimum search direction vector results in faster convergence toward the true KLT basis vectors. Again, at n=1000, $\epsilon^0(n)$ increases because the signal pattern changes. However, the error is still low and decreasing. Thus, the reconstructed signal is very close to the original signal.

Figure 6A:
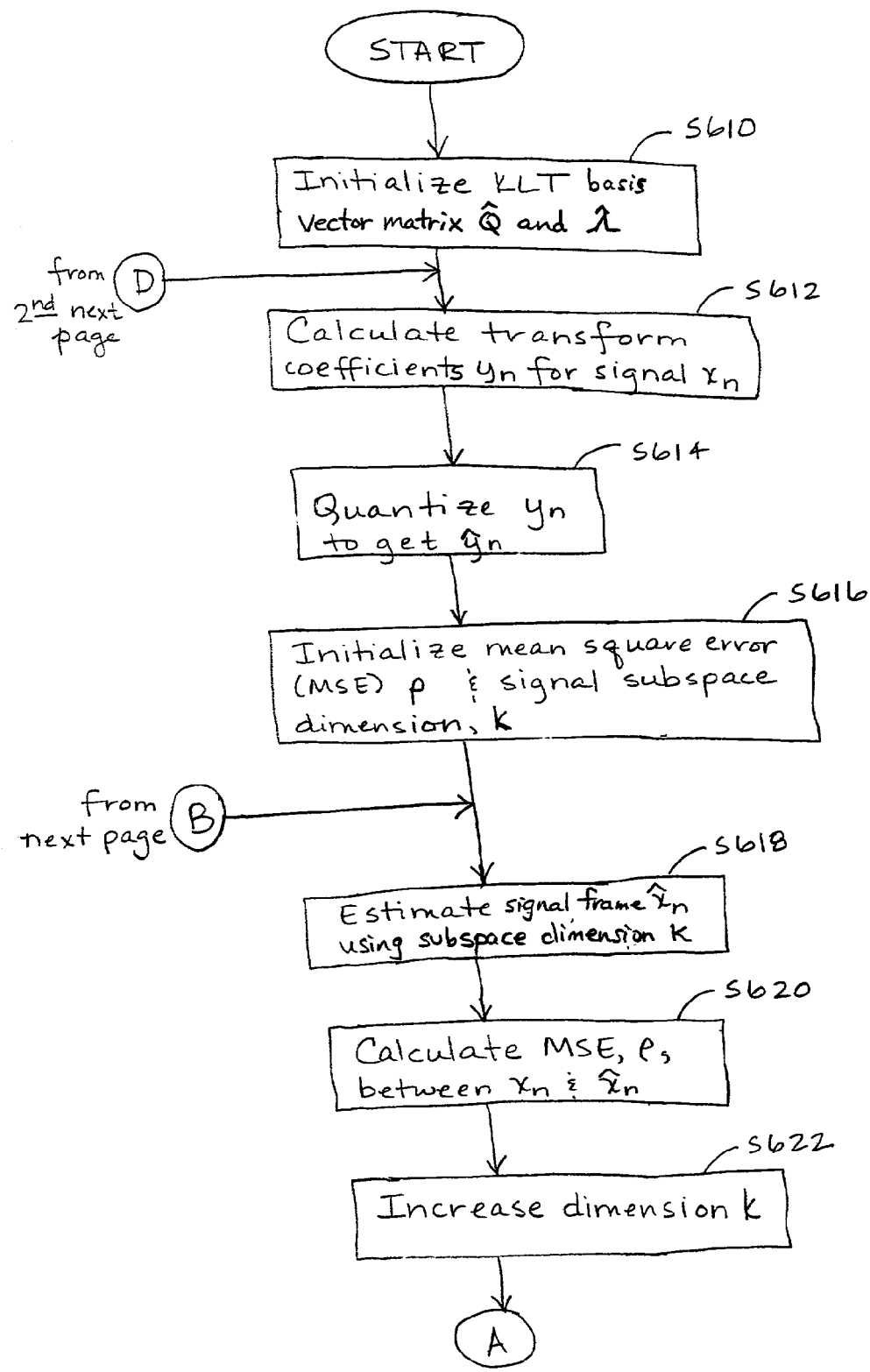
FIG. 6A is a flowchart of the steps performed at the transmitter in a third embodiment of the invention in which the KLT basis vectors are estimated based on the transform coefficients and the number of KLT transform coefficients.
Figure 6A:
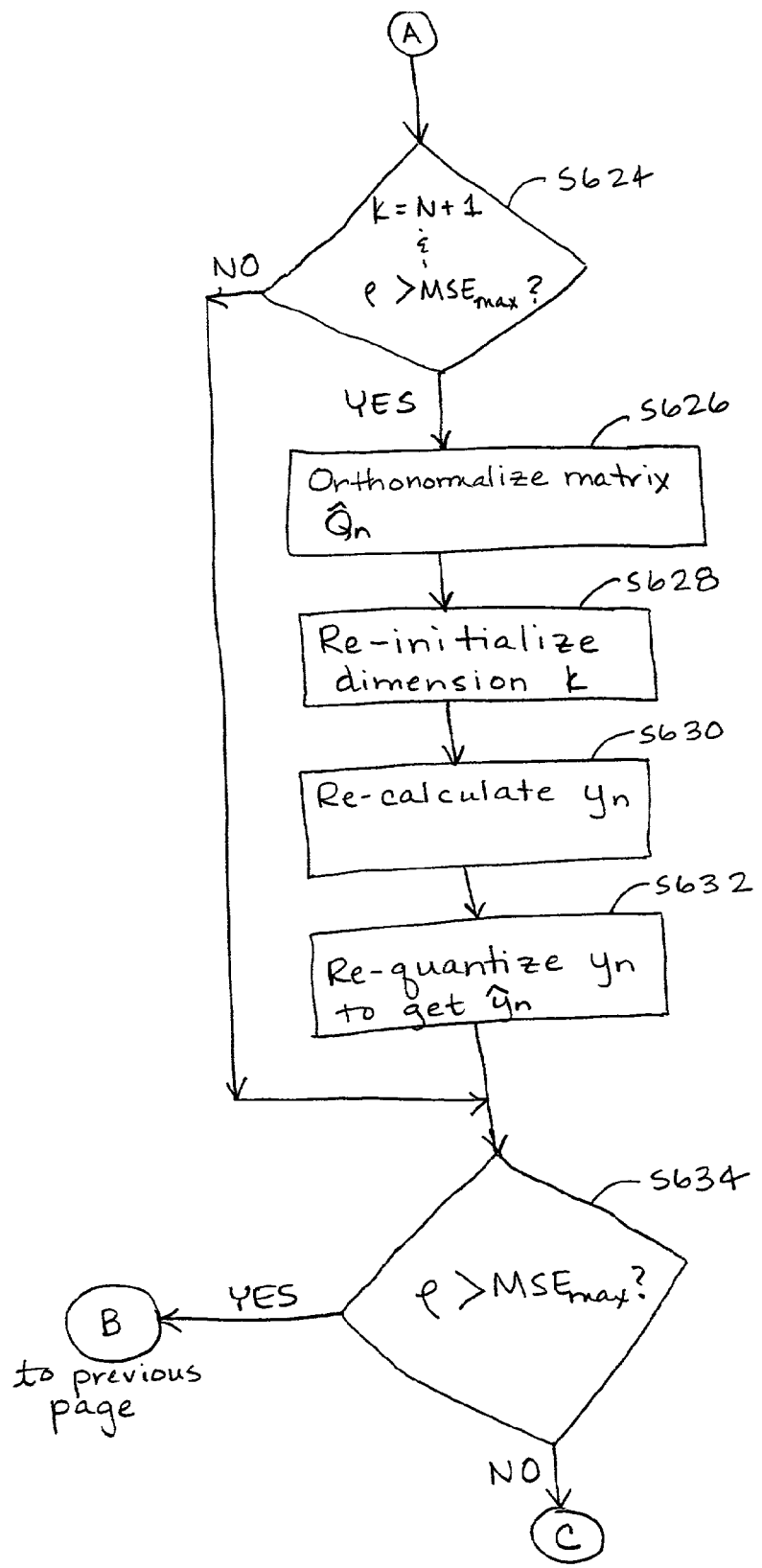
Figure 6A:
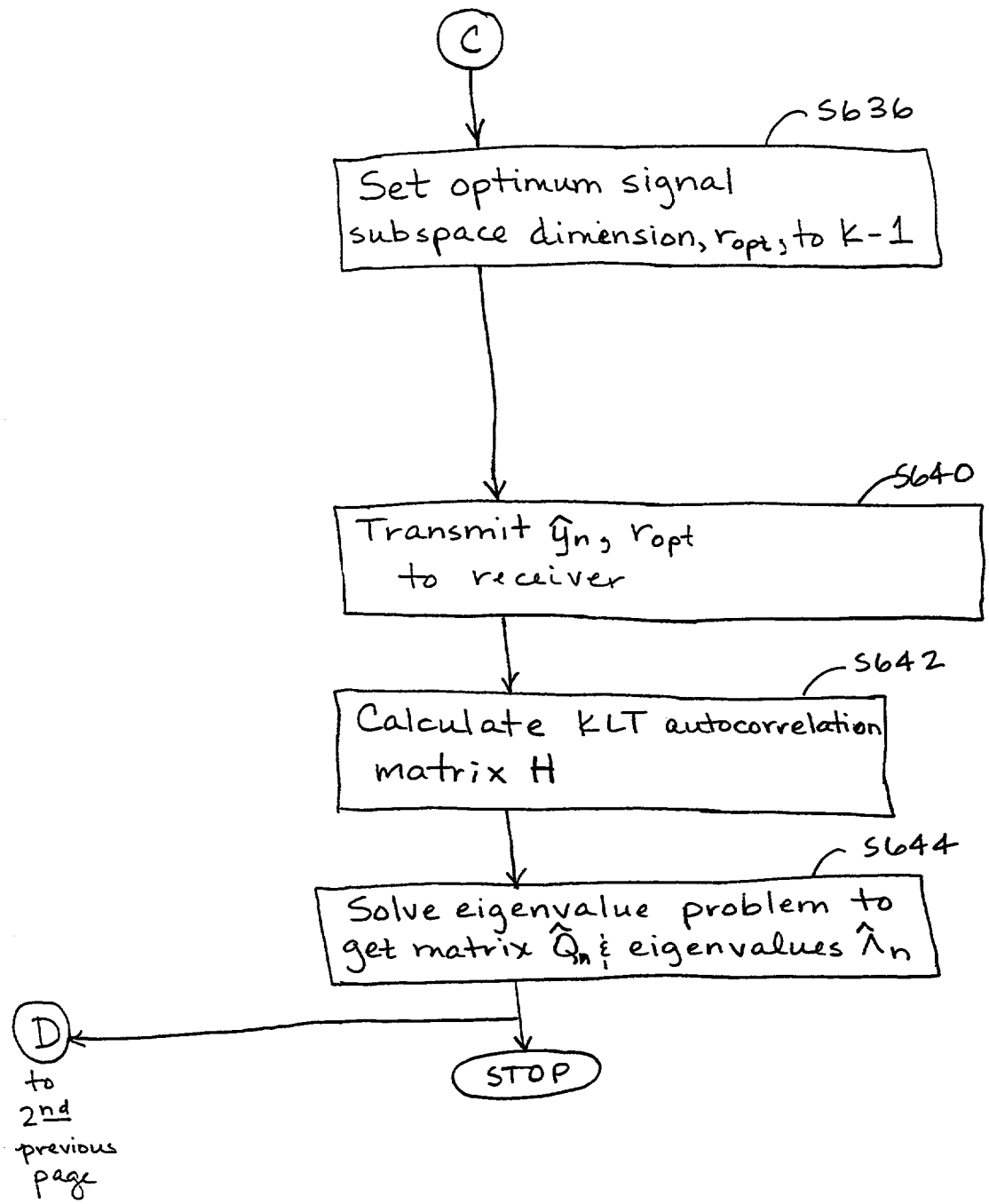
Figure 6B:
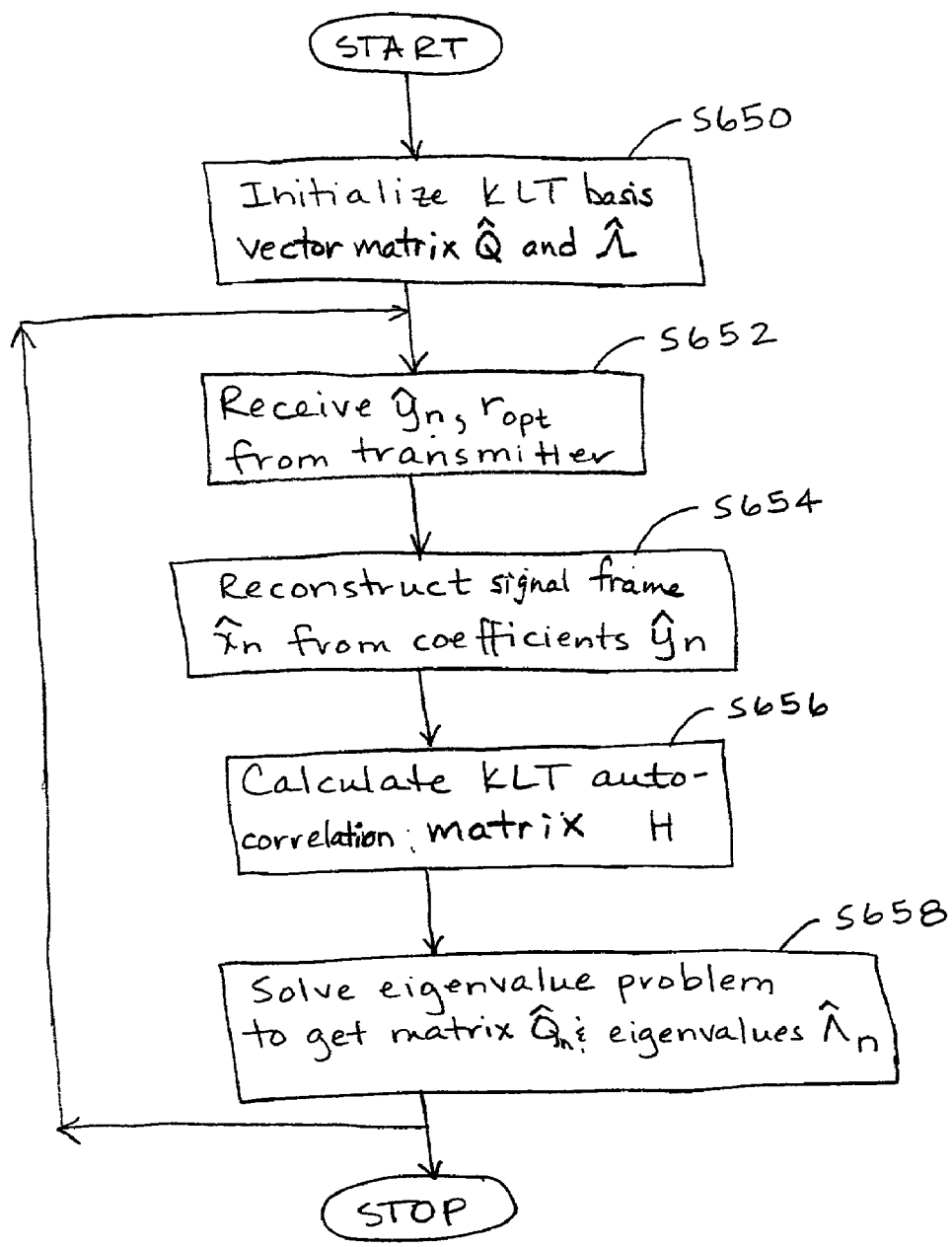
FIG. 6B is a flowchart of the steps performed at the receiver in the third embodiment of the invention in which the KLT basis vectors are estimated based on the transform coefficients and the number of KLT transform coefficients.

FIGS. 6A–6C show a third embodiment of the method of KLT coding of the present invention. In this embodiment, the dimension of the signal subspace is not known a priori. In practice, the eigenstructure of most signals tends to vary considerably over time. In such cases reconstructing the signal is challenging. Therefore, it is desirable to have a mechanism for adjusting the signal subspace dimension to accommodate signal variations. One approach is to estimate all N eigenvectors, in which case no search direction vector is used. An advantage of this approach is that the eigenvectors found are those of the sample autocorrelation matrix.

FIG. 6A shows the steps performed at the transmitter in the method of the third embodiment. In step S610, the KLT basis vector matrix $\hat{Q}$ and the KLT eigenvalue matrix $\hat{\Lambda}$ are initialized to the N by N identity matrix.

In step S612, the transform coefficients $y_n$ are calculated from the previously estimated basis vector matrix $\hat{Q}_{n-1}$, prior to expansion, and the original signal $x_n$ as in Equation (2).

In step S614, the transform coefficients $\overline{y}_n$ are quantized to produce $\hat{y}_n$.

In step S616, the mean squared error $\rho$ and the signal subspace dimension k are initialized.

In step S618, the original signal frame is reconstructed using the initial signal subspace dimension k to produce $\hat{x}_n$.

In step S620, the mean squared error is determined from the reconstructed signal frame and the original signal frame, according to Equation (6):

$$\rho \equiv \frac{\|x_n - \hat{x}_n\|^2}{\|x_n\|^2} \tag{6}$$

In step S622, the signal subspace dimension k is incremented by 1. The dimensions of the subspace are increased until enough basis vectors are present to meet the predetermined mean squared error threshold $MSE_{max}$, i.e., the basis vectors adequately span the signal space. If, however, the dimension N of the vector space is reached and the mean squared error threshold $MSE_{max}$ is still not met as inquired in step S624, then the following steps are performed.

In step S626, the columns of the KLT basis vector matrix $\hat{Q}_n$ are orthonormalized.

In step S628, the dimension of the subspace k is reset to 1.

In step S630, the KLT transform coefficients are determined for the reset subspace.

In step S632, the KLT transform coefficients are quantized.

If, in step S624, the N-dimensional vector space is not exceeded or the mean squared error threshold is met, then step S634 is performed. If the mean squared error still does not meeting the threshold, steps S618–S634 are repeated at a higher subspace dimension.

In step S634, if the mean squared error threshold has been met, however, then the optimum signal space dimension $r_{opt}$ (also indicating the number of KLT coefficients) is set in step S636 to k−1.

In step S640, the quantized transform coefficients $\hat{y}_n$ and the optimum signal subspace dimension $r_{opt}$ are transmitted to the receiver. Note that he number of bits allocated to encode each KLT transform coefficient may be predetermined or calculated using, for example, the optimal scheme given by Equation (9). Moreover, additional optional information may be transmitted to the receiver along with the KLT transform coefficients and this information may include data regarding the bit allocation scheme.

In step S642, matrix H is calculated. H is a unitary transformation of the autocorrelation matrix of $\hat{y}_n$, as shown in FIG. (7):

$$H = \gamma \hat{\Lambda}_{n-1} + \hat{y}_n y_n^T \tag{7}$$

in which γ is a constant between 0 and 1 and $\hat{\Lambda}_{n-1}$ is the estimated eigenvalue matrix. H then defines a generalized eigenvalue problem as shown in Equation (8):

In step S644, using standard techniques, the generalized eigenvalue problem is solved for $\hat{Q}_n$ and $\hat{\Lambda}_n$. Thus the KLT basis vectors are estimated at the transmitter.

Steps S612–S644 are repeated for all additional signal frames.

FIG. 6B shows the steps performed at the receiver in the method of the third embodiment. In step S650, the KLT basis vector matrix $\hat{Q}$ and the KLT eigenvalue matrix $\hat{\Lambda}$ are initialized to the N by N identity matrix.

In step S652, the receiver receives the KLT transform coefficients and the signal subspace dimension (also indicating the number of KLT coefficients) from the transmitter. Note that additional optional information may also be received at this step, including information regarding the bit allocation scheme used to encode the KLT transform coefficients.

In step S654, the KLT transform coefficients are used to reconstruct the original signal frame from Equation (5) based on the transform coefficients corresponding to $r_{opt}$ in which the transform coefficients for signal subspace dimensions greater than $r_{opt}$ are set to zero.

In step S656, matrix H is calculated according to Equation (7).

In step S658, the KLT basis vector matrix and corresponding eigenvalues of the original signal frame are estimated using Equation (8). Thus the receiver can estimate the KLT basis vectors and use them to reconstruct the original signal frame without having received the basis vectors from the transmitter.

Steps S652–S658 are repeated for all additional signal frames.

FIG. 6C shows an exemplary algorithm for performing KLT coding in the third embodiment.

Figure 7:
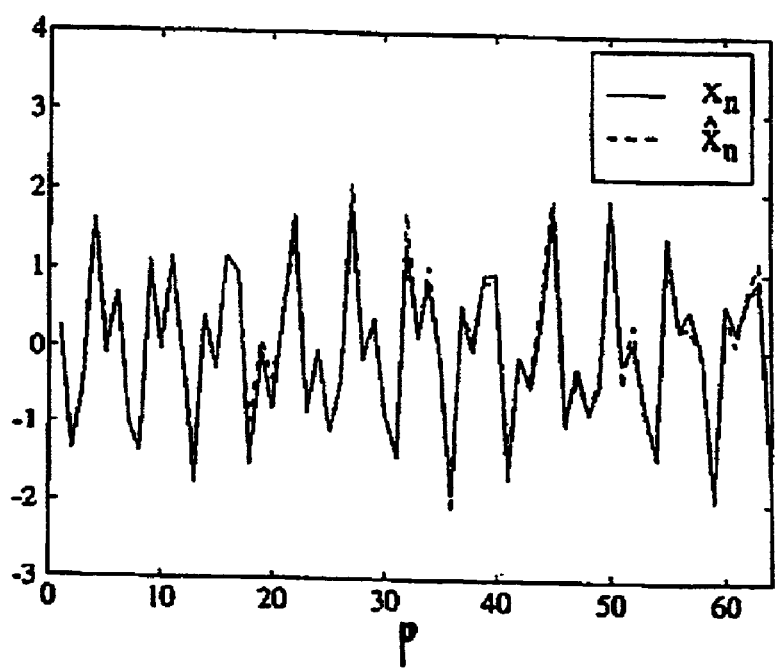
FIG. 7 is a graph illustrating an exemplary comparison between the original signal and the reconstructed signal produced by the embodiment of FIGS. 6A–6C.

FIG. 7 is a graph showing an exemplary result of KLT coding using the method of the third embodiment of the present invention. FIG. 7 shows an original and reconstructed signal obtained using the quantized KLT transform coefficients without transmitting the basis vectors. The mean squared error is minimal as can be seen by the closeness of the two signals.

Figure 8A:
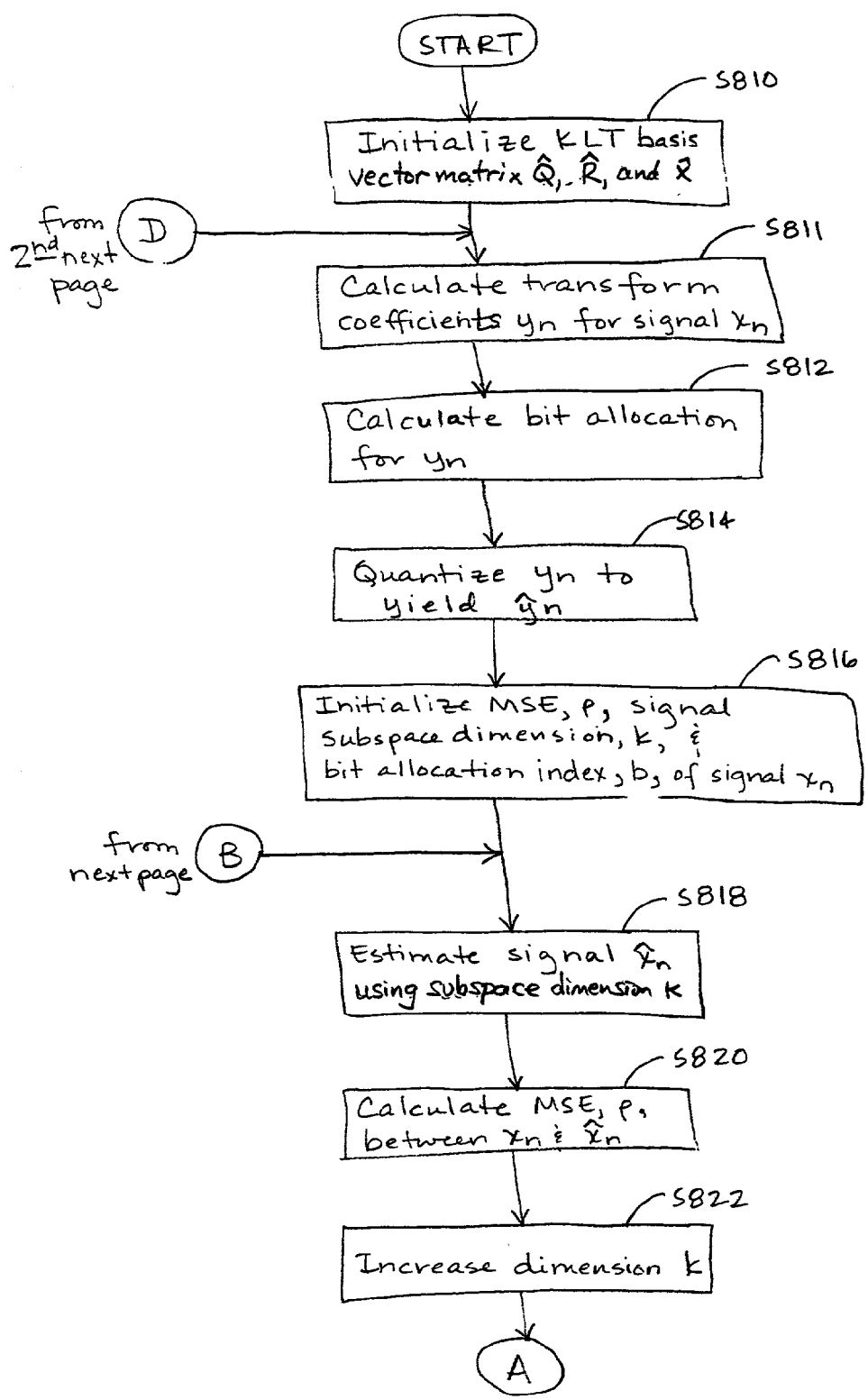
FIG. 8A is a flowchart of the steps performed at the transmitter in a fourth embodiment of the invention in which the KLT basis vectors are estimated based on the transform coefficients, the number of KLT coefficients, and the number of bits per coefficient.
Figure 8A:
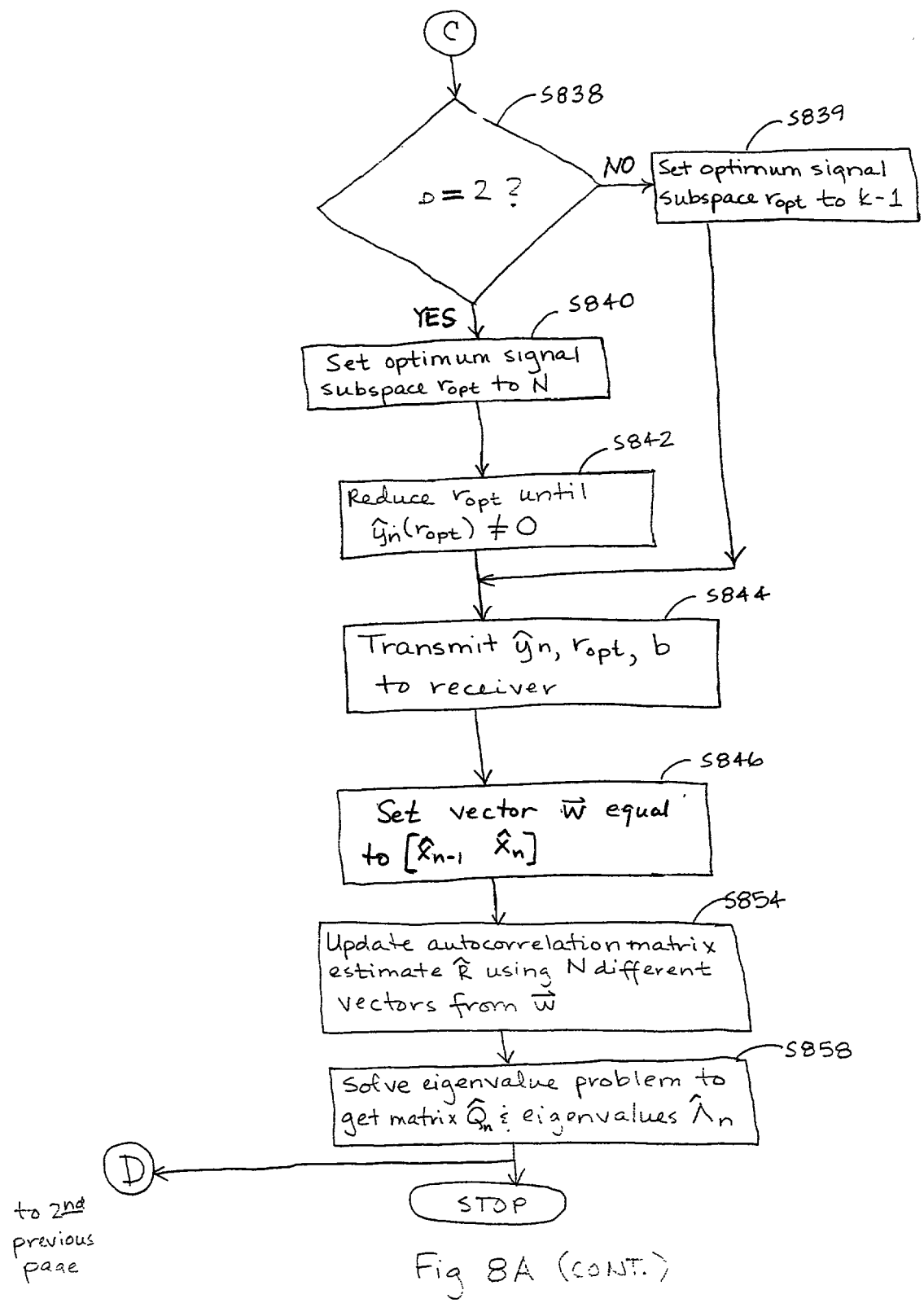
Figure 8A:
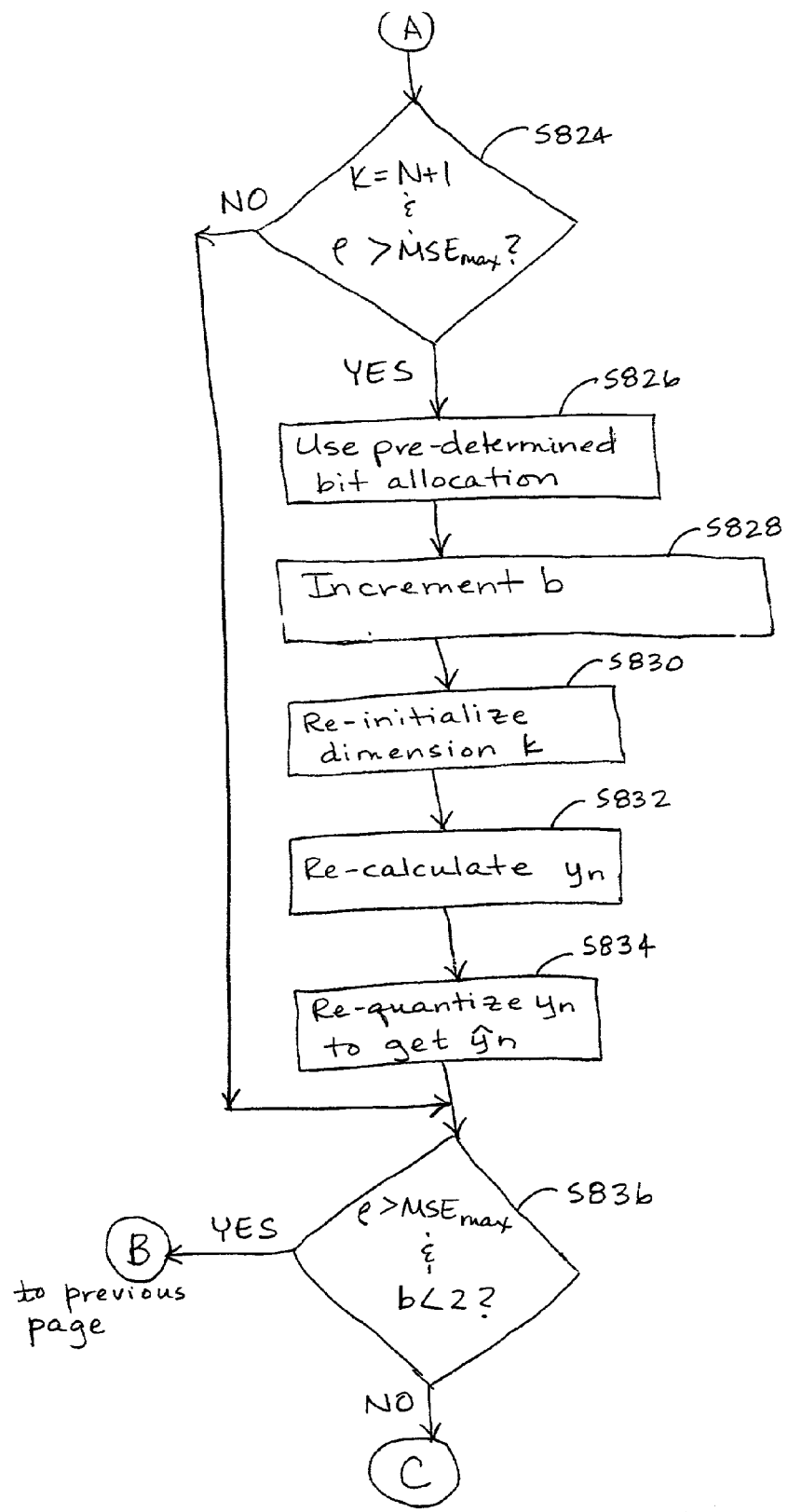
Figure 8B:
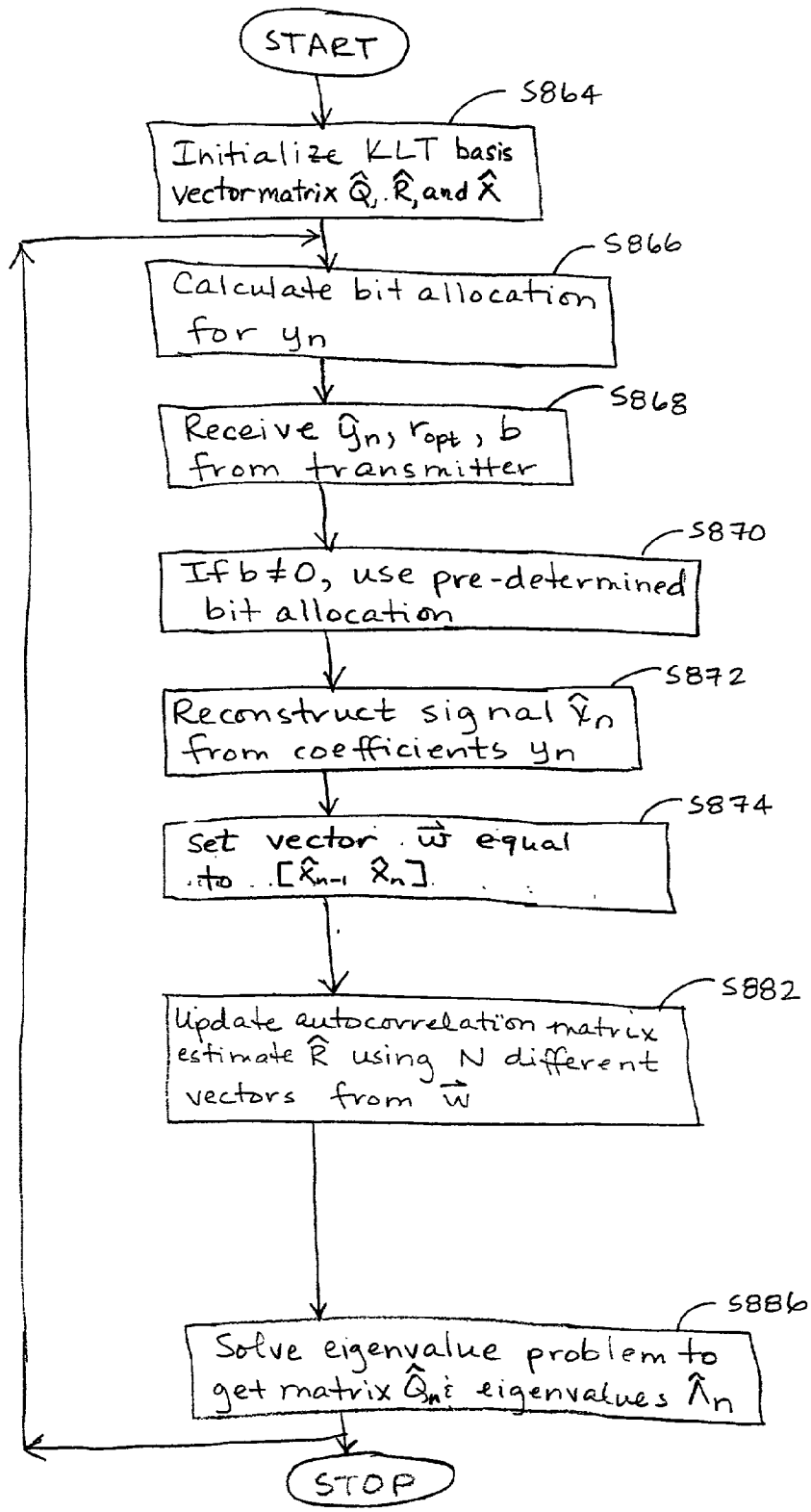
FIG. 8B is a flowchart of the steps performed at the receiver in the fourth embodiment of the invention in which the KLT basis vectors are estimated based on the transform coefficients, the number of KLT coefficients, and the number of bits per coefficient.

FIGS. 8A–8C show a fourth embodiment of the method of KLT coding of the present invention. In this embodiment, rather than updating the reduced autocorrelation matrix F with the KLT coefficients, the sample autocorrelation matrix is updated with the reconstructed signal frame $\hat{x}_n$. Moreover, instead of updating $\hat{R}_n$ on a frame-by-frame basis, we can update it on a sample by sample basis by concatenating $\hat{x}_{n-1}$ with $\hat{x}_n$. This enables a more accurate estimate of the sample autocorrelation matrix since more signal frames are used in its computation.

FIG. 8A shows the steps performed at the transmitter in the method of the fourth embodiment. In step S810, the KLT basis vector matrix $\hat{Q}$ is initialized to the N by N identity matrix, $\hat{x}_n$ is initialized to a zero vector of length N, and the sample autocorrelation matrix $\hat{R}$ is initialized to the N by N identity matrix multiplied by a small constant less than 1.

In step S811, the transform coefficients $y_n$ are calculated from the previously estimated basis vector matrix $\hat{Q}_{n-1}$ prior to expansion, and the original signal $x_n$ as in Equation (2).

In step S812, the number of bits allocated to encode each transform coefficient is calculated using Equation (9):

$$b_k = B + 0.5 \log_2 \frac{[\hat{\Lambda}_{n-1}]_k}{\prod_{j+1}^{r_{opt}^{-1}} [\hat{\Lambda}_{n-1}]_k} \tag{9}$$

where $b_k$ is the number of bits allocated to the $k^{th}$ transform coefficient, B is a constant, and $[\hat{\Lambda}_{n-1}]_k$ is the $k^{th}$ eigenvalue. The bit allocation in Equation (9) is the standard rule for minimizing mean-squared error.

In step S814, the transform coefficients $y_n$ are quantized to produce $\hat{y}_n$.

In step S816, the mean squared error ρ, the signal subspace dimension k, and the bit allocation index b are initialized.

In step S818, the original signal is reconstructed at the initial signal dimension k to produce $\hat{x}_n$.

In step S820, the mean squared error is determined for the reconstructed signal and the original signal, as in Equation (10):

$$\rho = \|\hat{x}_n - x_n\|^2 \tag{10}$$

In step S822, the signal subspace dimension k is incremented by 1. The dimensions of the subspace are increased until enough basis vectors are present to meet the mean squared error threshold, i.e., the KLT basis vectors adequately span the signal space. If, however, the dimension N of the vector space is reached and the mean squared error threshold is still not met as inquired in step S824, then the following steps are performed.

In step S826, a predetermined bit allocation is used.

In step S828, the bit allocation index b is incremented.

In step S830, the dimension of the subspace k is reset to 1.

In step S832, the transform coefficients are determined for the reset subspace.

In step S834, the KLT transform coefficients are quantized.

In step S824, if the N dimensional vector space is not exceeded or the mean squared error threshold is met, then the process goes to step S836. If the mean squared error still does not meet the threshold and bits have successfully been allocated for coding the transform coefficients, e.g. b<2, steps S818–S836 are repeated at a higher subspace dimension.

In step S836, if either the mean squared error threshold has been met or the bit allocation has not been successful, however, then step S838 is performed. If, in step S838, the bit allocation index does not equal 2, the optimum signal space dimension $r_{opt}$ (also called the number of KLT coefficients) is set in step S839 to k−1.

In step S840, if the bit allocation index equals 2, the optimum signal space dimension $r_{opt}$ is set to N, the dimension of the vector space, and then, in step S842, reduced until $\hat{y}_n(r_{opt}) \neq 0$.

In step S844, the quantized transform coefficients $\hat{y}_n$, the optimum signal subspace dimension $r_{opt}$, and the bit allocation index b are transmitted to the receiver.

In step S846, the signal sample vector $\vec{w}$ is updated to include $\hat{x}_{n-1}$ and $\hat{x}_n$.

In step S854, the autocorrelation matrix $\hat{R}_{n-1,m}$ is updated for the mth signal sample (m=, 1 ..., N) from $\vec{w}$ in Equation (11):

$$\hat{R}_{n-1,m} = \gamma \hat{R}_{n-1,m-1} + WW^T \quad (11)$$

$\hat{R}_n$, the autocorrelation matrix after all N vectors of $\vec{w}$ are used, is then put into the generalized eigenvalue problem as shown in Equation (12):

$$\hat{R}_n \hat{Q}_n = \hat{Q}_n \hat{\Lambda}_n. \quad (12)$$

In steps S858, using standard techniques, the generalized eigenvalues problem is solved for $\hat{Q}_n$ and $\hat{\Lambda}_n$. Thus the KLT basis vectors are estimated at the transmitter.

Steps S811–S858 are repeated for all additional signal frames.

FIG. 8B shows the steps performed at the receiver in the method of the fourth embodiment. In step S864, the KLT basis vector matrix $\hat{Q}$ is initialized to the N by N identity matrix, $\hat{x}_n$ is initialized to a zero vector of length N, and the sample autocorrelation matrix $\hat{R}$ is initialized to the N by N identity matrix multiplied by a small constant less than 1.

In step S866, the number of bits allocated are calculated using Equation (9).

In step S868, the KLT transform coefficients, the signal subspace dimension (also indicating the number of KLT coefficients), and the bit allocation index are transmitted to the receiver from the transmitter. If the bit allocation index does not indicate that the bit allocation was calculated using Equation (9), e.g. b=0, then the predetermined bit allocation is used in step S870.

In step S872, the signal is reconstructed using the quantized transform coefficients as in Equation (5).

Steps similar to the transmitter steps S846–S858 are performed at the receiver in steps S874–S886 to estimate the KLT basis vectors after each signal frame is reconstructed. As such, the receiver can estimate the KLT basis vectors and reach the same estimate as the transmitter. Hence, the receiver can estimate the KLT basis vectors and use them to reconstruct the original signal successfully without having received the basis vectors from the transmitter.

Steps S864–S886 are repeated for all additional signal frames.

FIG. 8C shows an exemplary algorithm for performing KLT coding in the fourth embodiment.

Figure 9:
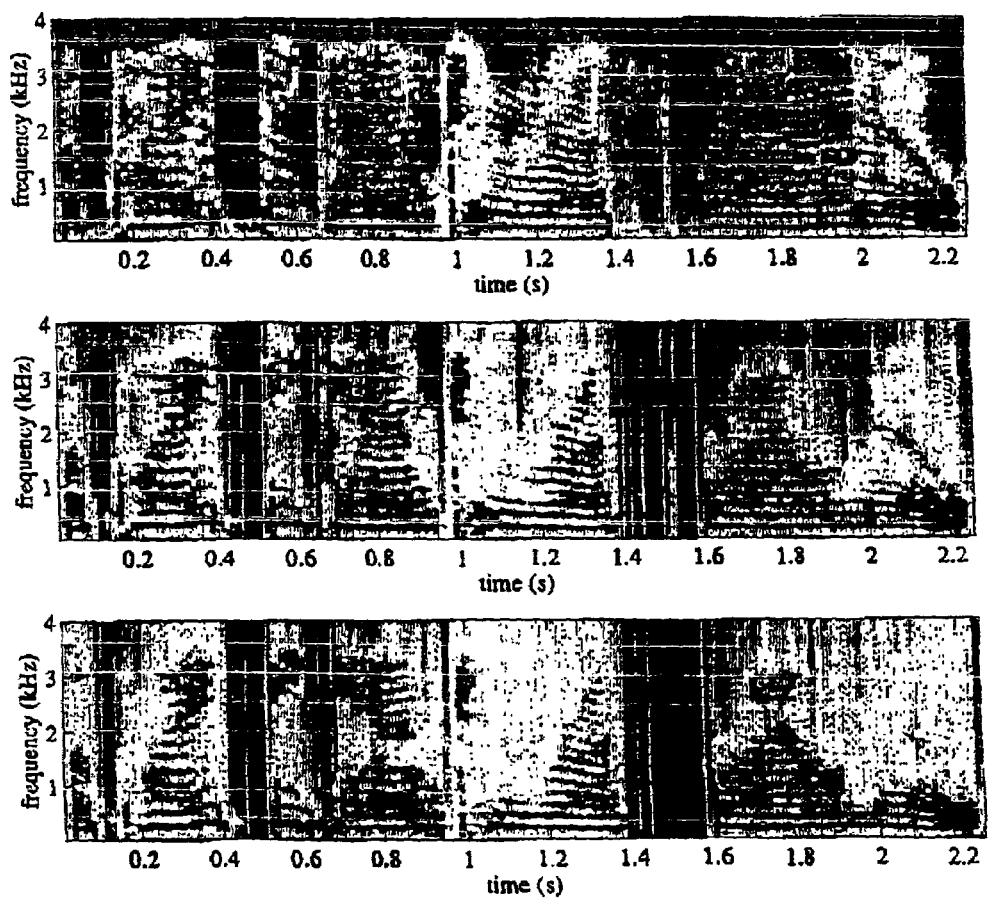
FIG. 9 is a graph illustrating an exemplary result of the fourth embodiment of FIGS. 8A–8C.

FIG. 9 is a spectrogram of an original speech signal and the reconstructed signal at two different bit allocations, as derived according to the fourth embodiment. The spectrogram shows the signal frequency over a time period. At both allocations, the reconstructed signals are very close to the original signal. In addition, minimal degradation of the signal is experienced.

Figure 10A:
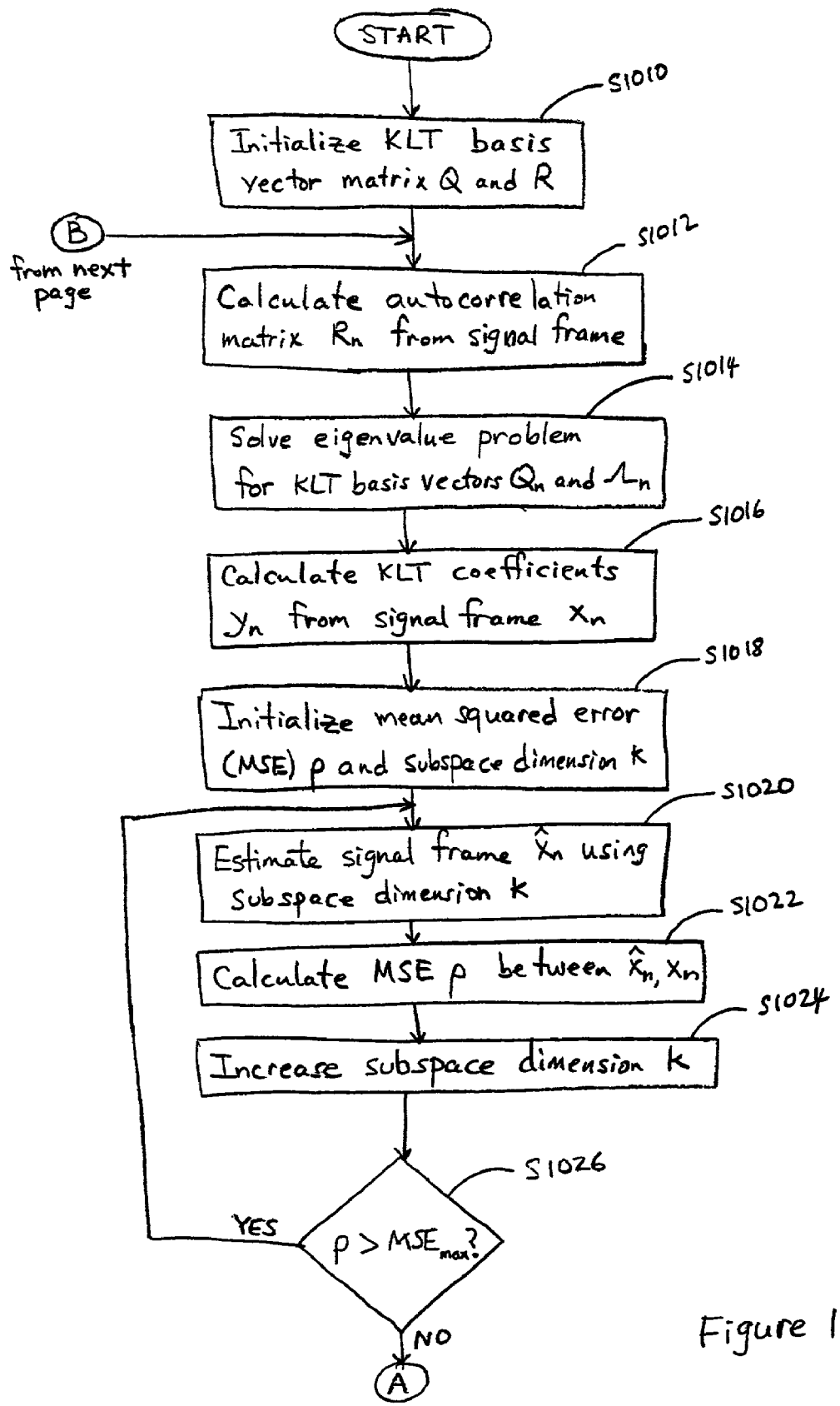
FIG. 10A is a flowchart of the steps performed at the transmitter in a fifth embodiment of the invention.
Figure 10A:
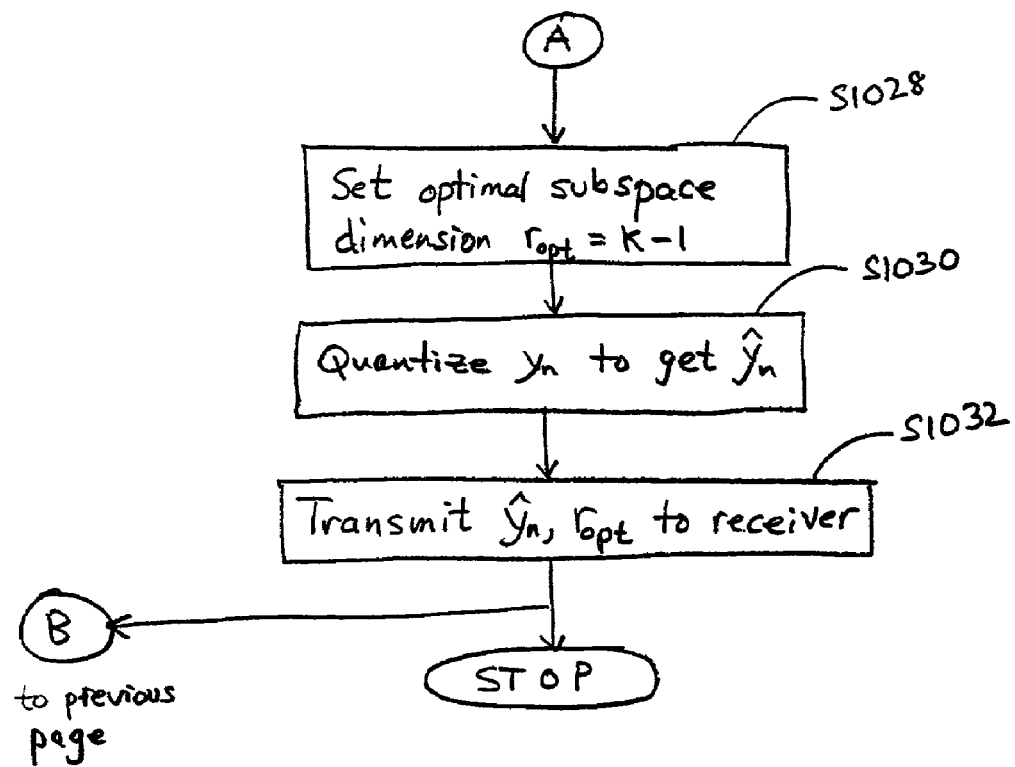
Figure 10B:
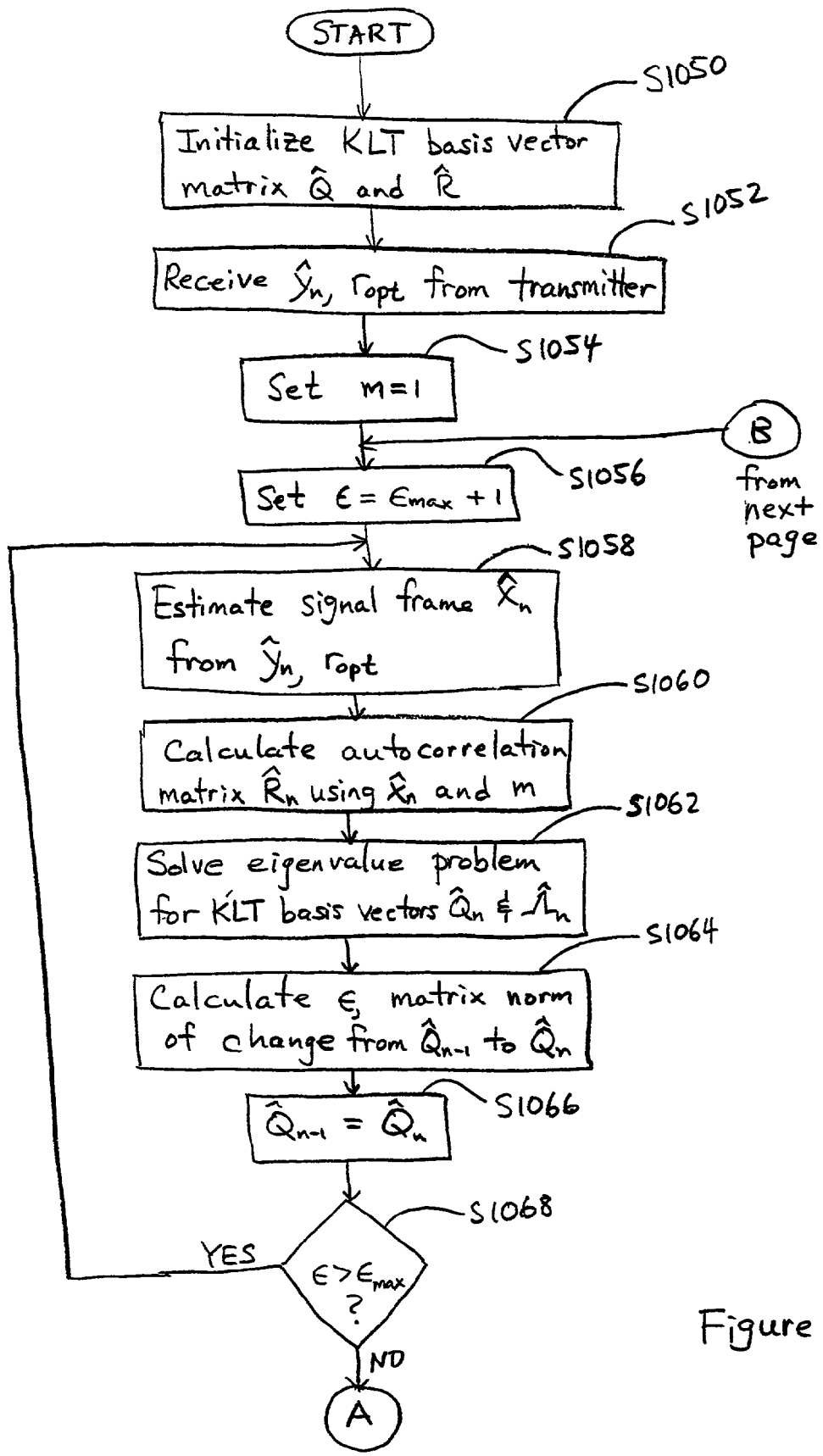
FIG. 10B is a flowchart of the steps performed at the receiver in the fifth embodiment of the invention.
Figure 10B:
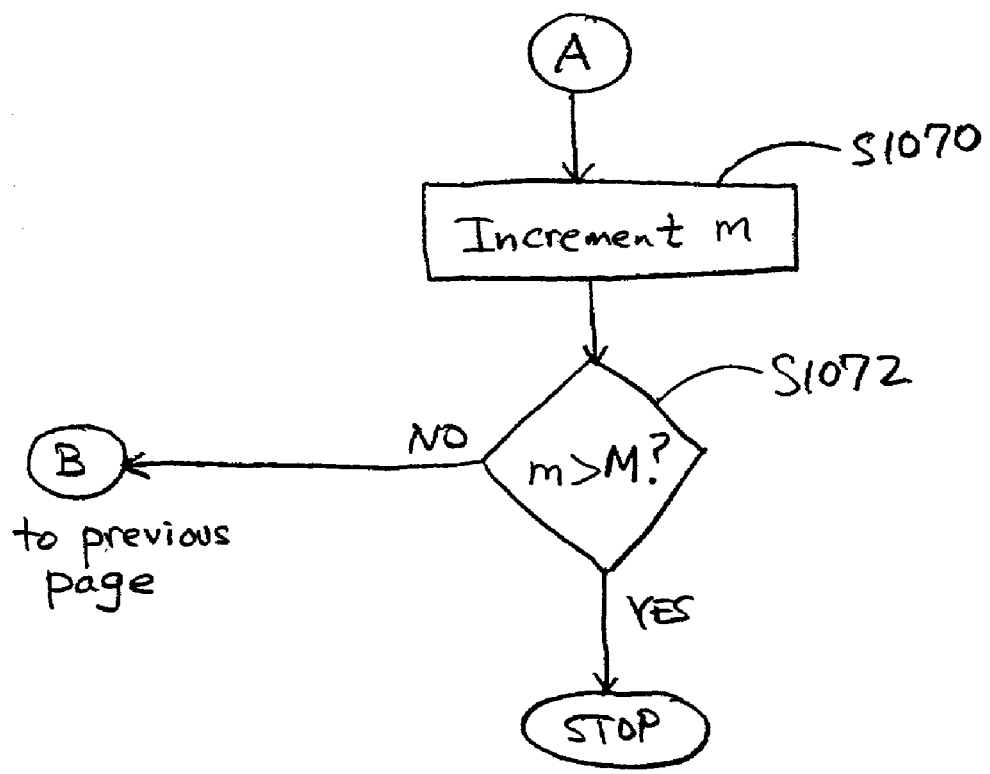

FIGS. 10A–10C show a preferred fifth embodiment of the method of KLT coding of the present invention. In this embodiment, the transmitter computes the KLT basis vectors based on the actual, unquantized signal frame $x_n$. Additionally, in this embodiment, the KLT coefficients are computed using the KLT basis vectors derived from all of the signal frames up to and including the current signal frame $x_n$. In the first four embodiments, the KLT coefficients are computed using the KLT basis vectors derived from the signal frames up to, but not including, the current frame (eigenvectors of $\hat{R}_{n-1}$)

FIG. 10A shows the steps performed at the transmitter in the method of the fifth embodiment. In step S1010, the KLT basis vector matrix Q is initialized to the N by N identity matrix and the autocorrelation matrix R is initialized to the N by N identity matrix times a small constant less than 1.

In step S1012, the autocorrelation matrix $R_n$ is calculated using the previous value $R_{n-1}$ and the current signal frame $x_n$.

In step S1014, using standard techniques, a generalized eigenvalue problem is solved for $Q_n$ and $\Lambda_n$.

In step S1016, the KLT transform coefficients $y_n$ are calculated from signal frame $x_n$ and the KLT basis vector matrix.

In step S1018, the mean squared error ρ and the signal subspace dimension k are initialized.

In step S1020, the original signal frame is reconstructed using the initial signal subspace dimension k to produce $\hat{x}_n$.

In step S1022, the mean squared error is determined from $\hat{x}_n$ and $x_n$ according to Equation (6).

In step S1024, the signal subspace dimension is incremented by 1.

In step S1026, if the mean squared error p exceeds a predetermined value $MSE_{max}$, steps S1020–S1026 are repeated. Otherwise, step S1028 is performed.

In step S1028, the optimum signal subspace dimension $r_{opt}$ is set to k−1.

In step S1030, the KLT transform coefficients $y_n$ are quantized to give $\hat{y}_n$.

In step S1032, the quantized KLT transform coefficients $y_n$ and the optimum signal subspace dimension $r_{opt}$ are transmitted to the receiver. Note that he number of bits allocated to encode each KLT transform coefficient may be predetermined or calculated using, for example, the optimal scheme given by Equation (9). Moreover, additional optional information may be transmitted to the receiver along with the KLT transform coefficients and this information may include data regarding the bit allocation scheme.

Steps S1012–S1032 are repeated for all additional signal frames.

FIG. 10B shows the steps performed at the receiver in the method of the fifth embodiment. In step S11050, the KLT basis vector matrix $\hat{Q}$ is initialized to the N by N identity matrix and the autocorrelation matrix $\hat{R}$ is initialized to the N by N identity matrix times a small constant less than 1.

In step S1052, the KLT transform coefficients and the signal subspace dimension (also indicating the number of KLT coefficients) are received from the transmitter. Note that additional optional information may also be received at this step, including information regarding the bit allocation scheme used to encode the KLT transform coefficients.

In step S1054, a counter m is initialized.

In step S1056, a value E measuring a matrix norm is initialized to be greater than a predetermined matrix norm value $\epsilon_{max}$.

In step S1058, the original signal frame is reconstructed using the initial signal subspace dimension k to produce $\hat{x}_n$.

In step S1060, the autocorrelation matrix $\hat{R}_n$ is calculated based on the value of the counter m, a predetermined parameter M, and $\hat{x}_n$.

In step S1062, using standard techniques, a generalized eigenvalue problem is solved for $\hat{Q}_n$ and $\hat{\Lambda}_n$. Depending on which eigenvalue solver is used, the sign of the eigenvectors in $\hat{Q}_n$ must be checked for consistency with those previously stored or initialized $\hat{Q}_{n-1}$.

In step S1064, the change $\epsilon$ in the KLT basis vector matrix is computed using a standard matrix norm according to Equation (13):

$$\epsilon = \|\hat{Q}_n - \hat{Q}_{n-1}\| \tag{13}$$

In step S1066, the current value of the KLT basis vector matrix $\hat{Q}_n$ is stored.

In step S1068, an inquiry is made whether the change $\epsilon$ in the KLT basis vector matrix is greater than the predetermined value $\epsilon_{max}$. If so, steps S1058–S1068 are repeated. If not, step S1070 and subsequent steps are performed.

In step S1070, the counter m is incremented.

In step S1072, an inquiry is made whether the counter m exceeds the predetermined value M. If not, steps S1056–S1068 are repeated. Otherwise, no further steps are performed.

Thus the receiver can estimate the KLT basis vectors and reached the same estimate as the transmitter. Hence, the receiver can estimate the KLT basis vectors and use them to reconstruct the original signal successfully without having received the basis vectors from the transmitter.

FIG. 10C shows an exemplary algorithm for performing KLT coding in the fifth embodiment.

Figure 11:
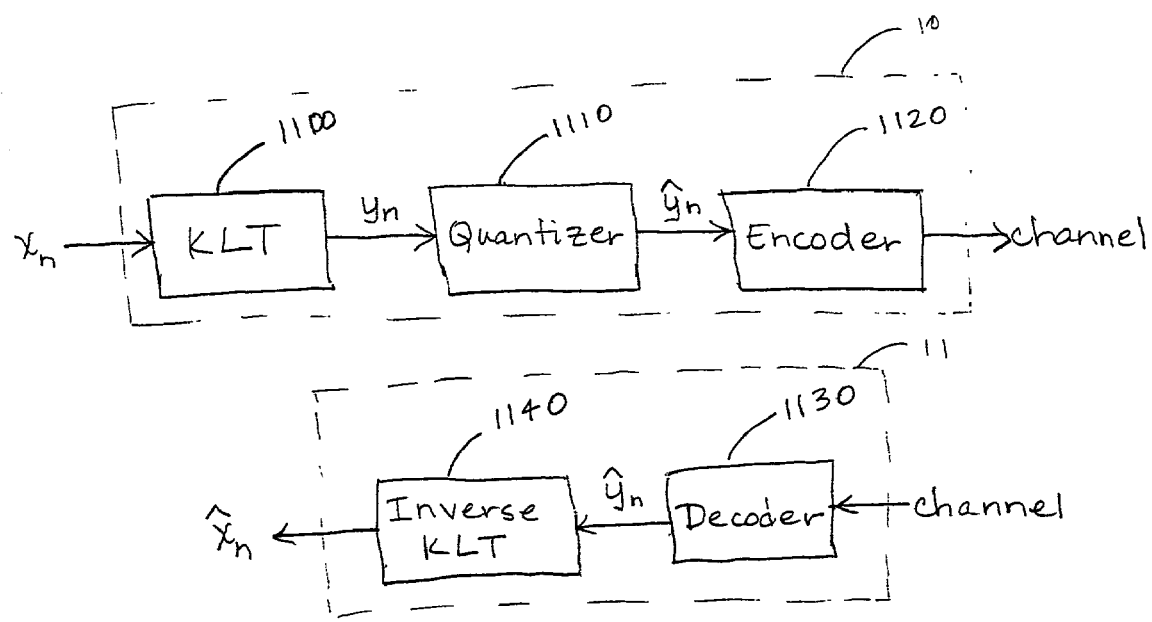
FIG. 11 is a block diagram of a transform coder using KLT coding of the present invention.

FIG. 11 shows an exemplary KLT coding system of the present invention. At the transmitter 10, an original signal frame $x_n$ is transformed by a KLT transformer 1100 into KLT transform coefficients $y_n$. The KLT transform coefficients are quantized at the quantizer 1110 to yield the signal $\hat{y}_n$. As a result of quantization and possibly discarding transform coefficients that are zero, the quantized signal $\hat{y}_n$ that enters the encoder 1120 is significantly reduced from the original signal $x_n$. The encoded signal is then sent along the channel. Depending on the specific embodiment, additional information may be sent as well. For example, the codebook index used in the second embodiment, the bit allocation index used in the fourth embodiment, etc.

At the receiver 11, the encoded signal is received through the channel into the decoder 1130. The signal is decoded, yielding the quantized transform coefficients $\hat{y}_n$. The original signal frame is reconstructed at the KLT inverse transformer 1140 to produce the reconstructed signal frame $\hat{x}_n$.

The mechanisms and processes set forth in the present description may be implemented using a conventional general purpose microprocessor programmed according to the teachings in the present specification, as will be appreciated to those skilled in the relevant art(s). Appropriate software coding can readily be prepared by skilled programmers based on the teachings of the present disclosure, as will also be apparent to those skilled in the relevant art(s).

The present invention thus also includes a computer-based product which may be hosted on a computer readable storage medium and include instructions which can be used to program a computer to perform a process in accordance with the present invention. The storage medium can include but is not limited to, any type of disk including floppy disk, optical disk, CD ROMS, magneto-optical disks, ROMS, RAMS, EPROMS, EEPROMS, flash memory, magnetic or optical cards, or any type of media suitable for storing electronic instructions. The instructions can be further read from other computer readable media such as transmission media of computer communication devices (e.g., Ethernet and wireless (e.g., IR or RF) adapters). Listings for sample implementations in MATLAB© of the first, second, and fourth embodiments are listed in the Appendix.

Numerous modifications and variations of the present invention are possible in light of the above teachings. For example, the structure of the algorithms used to implement the invention may take on any desired form. Further, in each embodiment, the number of KLT coefficients transmitted or received and the corresponding number of estimated KLT basis vectors can be as few as one. It is therefore to be understood that within the scope of the invention, the invention may be practiced otherwise than as specifically described herein.

```
%This is embodiment #1
%Programmer: Carlos E. Davila
%programmer: Carlos E. Davila
%Dept. of Electrical Engineering, Southern Methodist University
%date of last modification: 12/7/99
clear;
randn('state',0);
lam1 = 0.8;
lam0 = 0.8;
N = 16;
r = 4;
T_max = N*2000;
    x(1:T_max/2) = cos(0.35*pi*[1:T_max/2]) + ...
        cos(0.78*pi*[1:T_max/2] + 0.35*pi);
    x(T_max/2+1:T_max) = cos(0.6*pi*[1:T_max/2]) + ...
        cos(0.8*pi*[1:T_max/2] + 0.35*pi);
x1_rec = [ ];
x_hat_rec = [ ];
ntr = 1;
b = 8;
for itr = 1:ntr,
itr
sig_n = 0.0001;
x_max = max(x);
x_min = min(x);
del = (x_max - x_min)/b;
Ro = eye(N)*0.001;
U=randn(N,4);
U=orth(U);
q_3 = U(:,4);
q_2 = (U:,3);
q_1 = U(:,2);
q_0 = U(:,1);
x_0 = x(N*(itr-1)+1:N*itr)';
x_0 = x_0 - mean(x_0);
```

-continued

```
Q_hat = real([q_3 q_2 q_1 q_0]);
R_hat = eye(N)*0.001;
%for it = 2:50,
for it = 1:2000,
if rem(it,100) == 0
    [it err(it-1)]
end
x_0 = x(N*(it-1)+1:N*it)';
%x_0 = x_0 - mean(x_0);
    v_0 = randn(N,1);
    Ro = lam0*Ro + x_0*x_0';
    [Vo Do] = eig(Ro);
    Do = diag(Do);
    [Do Io] = sort(Do);
    q_0o = Vo(:,Io(N));
    q_1o = Vo(:,Io(N-1));
    q_2o = Vo(:,Io(N-2));
    q_3o = Vo(:,Io(N-3));
    Qo_hat = [q_0o q_1o q_2o q_3o];
%Q1 = [Q_hat v_0];
%xh = floor(x_0/del)*del;
%xh = v_0 - Q_hat*Q_hat'*v_0;
%xh = xh/norm(xh);
%Q1 = [Q_hat sign(x_0)];
    Q1 = [Q_hat v_0];
    A = lam1*Q1'*R_hat*Q1 + Q1'*x_0*x_0'*Q1;
    B = Q1'*Q1;
    [V D] = eig(A, B);
    %[V D] = eig(A);
    D = diag(D);
    for n = 1:5
        if abs(imag(D(n))) > 0.001
            D(n) = 0;
        end
    end
    [Ds I] = sort(D);
%   alpha = [V(:,I(6)) V(:,I(5)) V(:,I(4)) V(:,I(3))];
    alpha = real([V(:,I(5)) V(:,I(4)) V(:,I(3)) V(:,I(2))]);
    Beta = Q1*alpha;
    %Beta = Q*V;
    q_0 = Beta(:,1);
    q_1 = Beta(:,2);
    q_2 = Beta(:,3);
    q_3 = Beta(:,4);
    x_hat = Q_hat*Q_hat'*x_0;
    Q_hat = [q_0/norm(q_0) q_1/norm(q_1) q_2/norm(q_2) q_3/norm(q_3)];
Q_hat = Q_hat + flipud(Q_hat);
Q_hat = orth(Q_hat);
%R_hat = Q_hat*diag(flipud(Ds(2:5)))*Q_hat' + eye(N)*Ds(1);
R_hat = Q_hat*diag(flipud(Ds(2:5)))*Q_hat' + eye(N)*Ds(1);
P_Q = Q_hat*inv(Q_hat'*Q_hat)*Q_hat';
    P_Qo = Qo_hat*inv(Qo_hat'*Qo_hat)*Qo_hat';
    errq(it) = norm(P_Q - P_Qo,'fro');
    x_hat_rec = [x_hat_rec x_hat'];
    err(it) = norm(x_0 - x_hat)^2;
%   end
end
end%itr
%This is embodiment #2
%programmer: Carlos E. Davila
%Dept. of Electrical Engineering, Southern Methodist University
%date of last modification: 12/9/99
clear;
lam1 = 0.7;
lam0 = 0.7;
N = 32;
T_max = N*2000;
    x(1:T_max/2) = cos(0.3*pi*[1:T_max/2]) + ...
        cos(0.7*pi*[1:T_max/2] + 0.35*pi);
    x(T_max/2+1:T_max) = cos(0.6*pi*[1:T_max/2]) + ...
        cos(0.8*pi*[1:T_max/2] + 0.35*pi);
x1_rec = [ ];
x_hat_rec = [ ];
ntr = 1;
b = 8;
for itr = 1:ntr,
    itr
    sig_n = 0.0001;
```

```
x_max = max(x);
x_min = min(x);
del = (x_max - x_min)/b;
Ro = eye(N)*0.001;
U=randn(N,4);
U=orth(U);
q_3 = U(:,4);
q_2 = U(:,3);
q_1 = U(:,2);
q_0 = U(:,1);
x_0 = x(N*(itr-1)+1:N*itr)';
x_0 = x_0 - mean(x_0);
Q_hat = real([q_3 q_2 q_1 q_0]);
R_hat = eye(N)*0.001;
v_0 = randn(N,1000);
%for it = 2:50,
for it = 1:2000,
if rem(it,100) == 0
    [it err(it-1)]
end
x_0 = x(N*(it-1)+1:N*it)';
%x_0 = x_0 - mean(x_0);
    Ro = lam0*Ro + x_0*x_0';
    [Vo Do] = eig(Ro);
    Do = diag(Do);
    [Do Io] = sort(Do);
    q_0o = Vo(:,Io(N));
    q_1o = Vo(:,Io(N-1));
    q_2o = Vo(:,Io(N-2));
    q_3o = Vo(:,Io(N-3));
    Qo_hat = [q_0o g_1o q_2o q_3o];
    pow_max = 0;
        for m = 1:1000
    xh = v_0(:,m);
    Q1 = [Q_hat xh];
    A = lam1*Q1'*R_hat*Q1 + Q1'*x_0*x_0'*Q1;
    B = Q1'*Q1;
    [Vr Dr] = eig(A, B);
    Dr = diag(Dr);
    for n = 1:5
        if abs(imag(Dr(n))) > 0.001
            Dr(n) = 0;
        end
    end
    [Drs Ir] = sort (Dr);
    pow = sum(Drs(2:5));
    if pow > pow_max
        pow_max = pow;
        V = Vr;
        I = Ir;
        Ds = Drs;
        v_n = xh;
    end
end%m
%   alpha = [V(:,I(6)) V(:,I(5)) V(:,I(4)) V(:,I(3))];
    alpha = [V(:,I(5)) V(:,I(4)) V(:,I(3)) V(:,I(2))];
    Q1 = [Q_hat v_n];
    Beta = Q1*alpha;
    %Beta = Q*V;
    q_0 = Beta(:,1);
    q_1 = Beta(:,2);
    q_2 = Beta(:,3);
    q_3 = Beta(:,4);
    Q_hat = [q_0/norm(q_0) q_1/norm(q_1) q_2/norm(q_2) q_3/norm(q_3)];
    x_hat = Q_hat*Q_hat'*x_0;
    R_hat = Q_hat*diag(flipud(Ds(2:5)))*Q_hat' + eye(N)*Ds(1);
    P_Q = Q_hat*inv(Q_hat'*Q_hat)*Q_hat';
        P_Qo = Qo_hat*inv(Qo_hat'*Qo_hat)*Qo_hat';
    %err(it) = norm(P_Q - P_Qo,'fro')/ntr;
    x_hat_rec = [x_hat_rec x_hat'];
    err(it) = norm(x_0 - x_hat)^2;
    [it err(it)]
% end
end
end%itr
%This is embodiment #4
%Programmer: Carlos E. Davila
%programmer: Carlos E. Davila
```

```
%Dept. of Electrical Engineering, Southern Methodist University
%date of last modification: 11/10/00
clear;
randn('state',0);
lam1 = 0.995;
sample_rate = 8000;
mse_max = 0.9e-2;
%mse_max = 5e-2;
N = 64;
M = 1024;
r = N;
T_max = N*2000;
%load x
load s18
%load err_s18;
%load m9
%x = err_s18';
x = x'/norm(x)*33.5326;
%wc = 0.6;
%h = [sin(wc*pi*[-16:16])./([-16:16]*pi)];
%h(17) = wc;
%x = filter(h,1,x);
bitrate = 0;
eval_min = 25e-3;
b_min = 3;
max_repeats = 2;
rep_rate = 6;
rate_0 = 4;
k_max = floor(N/2)+1;
k_max = N;
nstd = 6;
b = rate_0*ones(1,k_max);
x_fs_0 = 4*ones(1,k_max);
Do = 10*ones(1,N);
%    x(1:T_max/2) = cos(0.35*pi*[1:T_max/2]) + ...
%       cos(0.78*pi*[1:T_max/2] + 0.35*pi);
%    x(T_max/2+1:T_max) = cos(0.6*pi*[1:T_max/2]) + ...
%       cos(0.8*pi*[1:T_max/2] + 0.35*pi);
x1_rec = [ ];
x_hat_rec = [ ];
err_cnt = 0;
x_hat = zeros(N, 1);
Q_hat=randn(N,r);
Q_hat=orth(Q_hat);
Lambda = diag([r:-1:1]/r);
R_hat = Q_hat*Lambda*Q_hat'*0.000000001;
v_0 = randn(N,M);
for m = 1:M,
    v_0(:,m) = v_0(:,m)/norm(v_0(:,m));
end
m_opt = zeros(1,length(x)/N);
for it = 1:length(x)/N,
        x_0 = x(N*(it-1)+1:N*it)';
        %Transmitter search for best search direction
        %Determine how many KLT coefficients to use
        %Q_hat=orth(Q_hat);
        mse = 100;
        y1 = Q_hat'*x_0;
        %update quantization parameters
        rate = rate_0;
        for k = 1:k_max,
            b(k) = max(rate +
0.5*log2(Do(k)/max(prod(Do(1:k_max))^(1/k_max),eval_min)),0);
            b(k) = floor(b(k));
            b(k) = max(b(k),b_min);
            x_fs(k) = nstd*sqrt(Do(k));
        end
        y1 = quant2(y1,b,x_fs,k_max);
        x_hat_old = x_hat;
        k = 1;
        repeats = 0;
        while mse > mse_max & repeats < max_repeats%(used for N = 16)
% while mse > 1E-5
            x_hat = Q_hat(:,1:k)*y1(1:k);
            mse = norm(x_hat - x_0)^2/norm(x_0)^2;
            k = k + 1;
            if k == k_max+1 & mse > mse_max
%               for m = 2:N,
%                   q = Q_hat(:,m);
```

```
%               q = q - Q_hat(:,1:m-1)*Q_hat(:,1:m-1)'*q;
%               q = q/norm(q);
%               Q_hat(:,m) = q;
%
%           end%m
                    'missed'
%       k = k_max+1;
%       y1 = Q_hat'*x_0;
%           y1 = quant2(y1,b,x_fs,k_max);
%mse = 0;
repeats = repeats + 1;
x_fs = x_fs_0;
        for k = 1:50,
            b(k) = (rep_rate-k/50*rep_rate/2);
            %b(k) = rep_rate;
        end
        b = floor(b);
%       b(1:10) = 6;
%       b(11:20) = 4;
%       b(20:64) = 1;
        %B = B + 1;
        y0 = Q_hat'*x_0;
        y1 = quant2(y0,b,x_fs,k_max);
        %norm(y0 - y1)
        if repeats < max_repeats
            k = 1;
        end
end
end
r_opt = k-1; %this is the model order
m_opt(it) = r_opt;
for k = r_opt:-1:1,
    if norm(y1(k:r_opt)) == 0
        m_opt(it) = k-1;
    end
end
y1(r_opt+1:N) = zeros(N-r_opt,1);
mo(it) = r_opt;
err = x_hat - x_0;
err_max = 100;
for m = 1:M,
    v = v_0(:,m);
    alpha = v'*err;
    err_v = err - alpha*v;
    if norm(err_v) < err_max
        mvq_opt = m;
        err_hat = alpha*v;
        err_max = norm(err_v);
%       figure (4)
%       hold off
%       plot (err)
%       hold on
%       plot(err_hat,'r')
%       pause(0.001)
    end
end
% x_hat = x_hat + err_hat']';
x_frame = [x_hat_old' x_hat']';
for n = 1:N
    x_n = x_frame(n+1:n+N);
    R_hat = lam1*R_hat + x_n*x_n';
end
%R_hat = lam1*R_hat + x_hat'*x_hat';
        [Vr Dr] = eig(R_hat);
        Dr = diag(Dr);
        for n = 1:5
            if abs(imag(Dr(n))) > 0.001
                Dr(n) = 0;
            end
        end
        [Drs Ir] = sort (Dr);
        pow = sum(Drs(2:N));
        V = real(Vr);
        I = Ir;
        Ds = Drs;
    for k = 1:r,
        Q_hat(:,k) = V(:,I(N-k+1))/norm(V(:,I(N-k+1)));
    end%k
% R_hat = Q_hat*diag(flipud(Ds))*Q_hat';
```

-continued

```
%Receiver Processing
     %P_Q =
Q_hat(:,1:r_opt)*inv(Q_hat(:,1:r_opt)'*Q_hat(:,1:r_opt))*Q_hat(:,1:r_opt)';
%    P_Qo =
Qo_hat(:,1:r_opt)*inv(Qo_hat(:,1:r_opt)'*Qo_hat(:,1:r_opt))*Qo_hat(:,1:r_opt)
';
  % errq(it) = norm(P_Q – P_Qo,'fro');
  mse_opt(it) = mse;
    if rem(it,1) == 0
       [it r_opt m_opt(it) repeats]
       figure (1)
            hold off
              plot(x_0)
            hold on
         plot(x_hat, 'r')
         figure(2)
         hold off
         Do=flipud(Ds)*(1–lam1);
       % [Do_min k_max] = min(abs(Do-0.001));
         plot (real (Do(1:r_opt)))
         hold on
         plot(y1(1:r_opt).*y1(1:r_opt),'r')
         figure (3)
         plot (b)
              pause (0.001);
       end
       x_hat_rec = [x_hat_rec x_hat'];
       bitrate(it) = (sum(b(1:m_opt (it)))+1+log2(N))/(N/sample_rate);
             'bitrate:'
       [mean(bitrate) bitrate (it)]
       end%it
soundsc(x_hat_rec,sample_rate)
mse_tot = norm(x_hat_rec-
x(1:length(x_hat_rec)))^2/norm(x(1:length(x_hat_rec)))^2;
```

The invention claimed is:

1. A method for coding a signal frame at a transmitter using a Karhunen-Loeve transform (KLT), comprising the steps of:
   estimating KLT basis vectors of the signal frame;
   calculating KLT coefficients of the signal frame; and
   transmitting at least one of the KLT coefficients, but not the KLT basis vectors, to a receiver,
   wherein the step of estimating KLT basis vectors includes
      calculating an intermediate autocorrelation matrix using the signal frame, initial KLT basis vectors, initial KLT eigenvalues, and a search direction vector;
      solving a generalized eigenvalue problem to determine eigenvectors of the intermediate autocorrelation matrix; and
      updating the KLT basis vectors using the eigenvectors of the intermediate autocorrelation matrix.

2. The method of claim 1, wherein, at the transmitter, the step of transmitting comprises:
   quantizing the KLT coefficients; and
   encoding the KLT coefficients.

3. The method of claim 1, wherein the step of transmitting comprises discarding KLT coefficients that are equal to zero.

4. The method of claim 1, wherein the steps of estimating, calculating, and transmitting are repeated for a plurality of signal frames.

5. The method of claim 4, wherein the step of estimating KLT basis vectors comprises:
   calculating an intermediate autocorrelation matrix using the signal frame, previously stored KLT basis vectors, previously stored KLT eigenvalues, and a search direction vector;
   solving a generalized eigenvalue problem to determine eigenvectors and eigenvalues of the intermediate autocorrelation matrix; and
   updating the previously stored KLT basis vectors and the previously stored KLT eigenvalues using the eigenvectors and eigenvalues of the intermediate autocorrelation matrix.

6. The method of claim 1, wherein the step of transmitting further comprises transmitting an index into a codebook of search direction vectors, and
   wherein the step of estimating KLT basis vectors at the transmitter comprises:
      selecting a search direction vector using a previously stored codebook;
      calculating an intermediate autocorrelation matrix from the signal frame, initial KLT basis vectors, initial KLT eigenvalues, and the search direction vector;
      solving a generalized eigenvalue problem to determine eigenvectors and eigenvalues of the intermediate autocorrelation matrix;
      computing a sum of the eigenvalues of the intermediate autocorrelation matrix;
      repeating the steps of selecting, calculating, solving, and computing for all search directions in the codebook;
      determining an optimal codebook index of the search direction vector for which the sum of the eigenvalues is greater than all other search direction vectors in the codebook; and
      updating the KLT basis vectors using the eigenvectors of the intermediate autocorrelation matrix corresponding to the optimal codebook index.

7. The method of claim 4, wherein the step of transmitting further comprises transmitting an index into a codebook of search direction vectors, and
   wherein the step of estimating KLT basis vectors at the transmitter comprises:
      selecting a search direction vector using a previously stored codebook;
      calculating an intermediate autocorrelation matrix from the signal frame, previously stored KLT basis vectors, previously stored KLT eigenvalues, and the search direction vector;
      solving a generalized eigenvalue problem to determine the eigenvectors and eigenvalues of the intermediate autocorrelation matrix;
      computing a sum of the eigenvalues of the intermediate autocorrelation matrix;
      repeating the steps of selecting, calculating, solving, and computing for all search directions in the codebook;
      determining the optimal codebook index of the search direction vector for which the sum of the eigenvalues is greater than all other search direction vectors in the codebook; and
      updating the previously stored KLT basis vectors and the previously stored KLT eigenvalues using the eigenvectors and eigenvalues of the intermediate autocorrelation matrix corresponding to the optimal codebook index.

8. The method of claim 1, wherein the step of transmitting further comprises transmitting additional information indicating a number of the KLT coefficients being transmitted, and
   wherein the step of estimating the KLT basis vectors at the transmitter comprises:

determining an estimated signal frame using initial KLT basis vectors, the signal frame, and a subspace dimension;

calculating a error between the signal frame and the estimated signal frame;

repeating the determining and calculating steps until the error reaches a predetermined threshold;

setting a second subspace dimension equal to the subspace dimension for which the error reaches the predetermined threshold;

generating an intermediate autocorrelation matrix using the signal frame and initial KLT eigenvalues; and estimating the KLT basis vectors by solving a generalized eigenvalue problem using the intermediate autocorrelation matrix.

9. The method of claim 4, wherein the step of transmitting further comprises transmitting additional information indicating a number of the KLT coefficients being transmitted, and wherein the step of estimating the KLT basis vectors at the transmitter comprises:

determining an estimated signal frame using previously stored KLT basis vectors, the signal frame, and a subspace dimension;

calculating an error between the signal frame and the estimated signal frame;

repeating the determining and calculating steps until the error reaches a predetermined threshold;

setting a second subspace dimension equal to the subspace dimension for which the error reaches the predetermined threshold;

generating an intermediate autocorrelation matrix using the signal frame and previously stored KLT eigenvalues; and updating the previously stored KLT basis vectors and previously stored KLT eigenvalues by solving a generalized eigenvalue problem using the intermediate autocorrelation matrix.

10. The method of claim 2, wherein the step of transmitting further comprises transmitting additional information indicating a number of KLT coefficients being transmitted and a bit allocation scheme, and wherein the step of estimating the KLT basis vectors of the signal frame at the transmitter comprises:

determining an estimated signal frame using initial KLT basis vectors, the signal frame, and a subspace dimension;

calculating an error between the signal frame and the estimated signal frame;

repeating the determining and calculating steps until the error reaches a predetermined threshold;

setting a second subspace dimension equal to the subspace dimension for which the error reaches the predetermined threshold;

setting the bit allocation scheme based on the results of the repeating step;

calculating an intermediate autocorrelation matrix using the estimated signal frame, initial KLT basis vectors, an initial autocorrelation matrix, and an initial estimated signal frame; and estimating the KLT basis vectors by solving a generalized eigenvalue problem using the intermediate autocorrelation matrix.

11. The method of claim 4, wherein the step of transmitting further comprises quantizing the KLT coefficients, encoding the KLT coefficients, and transmitting additional information indicating a number of KLT coefficients being transmitted and a bit allocation scheme, and wherein the step of estimating the KLT basis vectors of the signal frame at the transmitter comprises:

determining an estimated signal frame using previously stored KLT basis vectors, the signal frame, and a subspace dimension;

calculating an error between the signal frame and the estimated signal frame;

repeating the determining and calculating steps until the error reaches a predetermined threshold;

setting a second subspace dimension equal to the subspace dimension for which the error reaches the predetermined threshold;

setting the bit allocation scheme based on the results of the repeating step;

updating a previously stored autocorrelation matrix using the estimated signal frame, previously stored KLT basis vectors, the previously stored autocorrelation matrix, and a previously stored estimated signal frame;

updating the previously stored KLT basis vectors by solving a generalized eigenvalue problem using the intermediate autocorrelation matrix; and updating the previously stored estimated signal frame.

12. The method of claim 1, wherein the step of transmitting further comprises transmitting additional information indicating a number of KLT coefficients being transmitted, and wherein the step of estimating the KLT basis vectors at the transmitter comprises:

calculating the autocorrelation matrix based on the signal frame and an initial autocorrelation matrix;

solving a generalized eigenvalue problem using the autocorrelation matrix to determine the KLT basis vectors.

13. The method of claim 4, wherein the step of transmitting further comprises transmitting additional information indicating a number of KLT coefficients being transmitted, and wherein the step of estimating the KLT basis vectors at the transmitter comprises:

calculating an updated autocorrelation matrix based on the signal frame and a previously stored autocorrelation matrix;

estimating the KLT basis vectors by solving a generalized eigenvalue problem using the updated autocorrelation matrix; and replacing the previously stored autocorrelation matrix with the updated autocorrelation matrix.

14. A transmitter for coding a signal frame using a Karhunen-Loeve transform (KLT), comprising:

an estimator configured to estimate KLT basis vectors of the signal frame;

a calculator configured to calculate KLT coefficients of the signal frame; and a transmitter configured to transmit at least one of the KLT coefficients, but not the KLT basis vectors, to a receiver, wherein the estimator includes:

means for calculating an intermediate autocorrelation matrix using the signal frame, initial KLT basis vectors, initial KLT eigenvalues, and a search direction vector;

means for solving a generalized eigenvalue problem to determine eigenvectors of the intermediate autocorrelation matrix; and means for updating the KLT basis vectors using the eigenvectors of the intermediate autocorrelation matrix.

15. A method for reconstructing a signal frame at a receiver using a Karhunen-Loeve transform (KLT), comprising the steps of:
  receiving KLT coefficients, without receiving corresponding KLT basis vectors, from a transmitter;
  estimating KLT basis vectors; and
  recreating the signal frame from the estimated KLT basis vectors and the received KLT coefficients,
  wherein the step of estimating the KLT basis vectors includes
    calculating an intermediate autocorrelation matrix using the received KLT coefficients, initial KLT basis vectors, initial KLT eigenvalues, and a search direction vector;
    solving a generalized eigenvalue problem to determine the eigenvectors and eigenvalues of the intermediate autocorrelation matrix; and
    updating the KLT basis vectors using the eigenvectors of the intermediate autocorrelation matrix.

16. The method of claim 15, wherein, at the receiver, the step of receiving comprises decoding the KLT coefficients.

17. The method of claim 15, wherein the steps of receiving, estimating, and calculating are repeated for a plurality of signal frames.

18. The method of claim 17, wherein the step of estimating KLT basis vectors at the receiver comprises:
  calculating an intermediate autocorrelation matrix using the received KLT coefficients, previously stored KLT basis vectors, previously stored KLT eigenvalues, and a search direction vector;
  solving a generalized eigenvalue problem to determine the eigenvectors and eigenvalues of the intermediate autocorrelation matrix; and
  updating the previously stored KLT basis vectors and the previously stored KLT eigenvalues using the results of solving the generalized eigenvalue problem.

19. The method of claim 15, wherein the step of receiving further comprises receiving an index into a codebook of search direction vectors, and
  wherein the step of estimating KLT basis vectors at the receiver comprises:
    selecting a search direction vector from a previously stored codebook using the received codebook index;
    calculating an intermediate autocorrelation matrix using the received KLT coefficients, initial KLT basis vectors, initial KLT eigenvalues, and the search direction vector;
    solving a generalized eigenvalue problem to determine the eigenvectors and eigenvalues of the intermediate autocorrelation matrix; and
    updating the KLT basis vectors using the eigenvectors of the intermediate autocorrelation matrix.

20. The method of claim 17, wherein the step of receiving further comprises receiving an index into a codebook of search direction vectors, and
  wherein the step of estimating KLT basis vectors at the receiver comprises:
    selecting a search direction vector from a previously stored codebook using the received codebook index;
    calculating an intermediate autocorrelation matrix using the received KLT coefficients, previously stored KLT basis vectors, previously stored KLT eigenvalues, and the search direction vector;
    solving a generalized eigenvalue problem to determine the eigenvectors and eigenvalues of the intermediate autocorrelation matrix; and
    updating the previously stored KLT basis vectors and the previously stored KLT eigenvalues using the eigenvectors and eigenvalues of the intermediate autocorrelation matrix.

21. The method of claim 15, wherein the step of receiving further comprises receiving additional information indicating a number of the KLT coefficients transmitted, and
  wherein the step of estimating KLT basis vectors at the receiver comprises:
    generating an intermediate autocorrelation matrix using the received KLT coefficients and previously stored KLT eigenvalues; and
    estimating the KLT basis vectors by solving a generalized eigenvalue problem using the intermediate autocorrelation matrix.

22. The method of claim 17, wherein the step of receiving further comprises receiving additional information indicating a number of the KLT coefficients transmitted, and
  wherein the step of estimating KLT basis vectors at the receiver comprises:
    generating an intermediate autocorrelation matrix using the received KLT coefficients, previously stored KLT basis vectors, and previously stored KLT eigenvalues; and
    updating the previously stored KLT basis vectors and the previously stored KLT eigenvalues by solving a generalized eigenvalue problem using the intermediate autocorrelation matrix.

23. The method of claim 16, wherein the step of receiving further comprises receiving additional information indicating the number of KLT coefficients transmitted and the bit allocation scheme, and
  wherein the step of estimating the KLT basis vectors at the receiver comprises:
    calculating an intermediate autocorrelation matrix using the KLT coefficients received in the receiving step, initial KLT basis vectors, an initial autocorrelation matrix, and an initial estimated signal frame; and
    estimating the KLT basis vectors by solving a generalized eigenvalue problem using the intermediate autocorrelation matrix.

24. The method of claim 17, wherein the step of receiving further comprises decoding the KLT coefficients and receiving additional information indicating a number of the KLT coefficients transmitted and a bit allocation scheme, and
  wherein the step of estimating the KLT basis vectors at the receiver comprises:
    calculating an intermediate autocorrelation matrix using the KLT coefficients received in the receiving step, previously stored KLT basis vectors, a previously stored autocorrelation matrix, and a previously stored estimated signal frame;
    updating the KLT basis vectors by solving a generalized eigenvalue problem using the intermediate autocorrelation matrix; and
    storing the estimated KLT basis vectors, an estimated signal frame, and the intermediate autocorrelation matrix.

25. The method of claim 15, wherein the step of receiving further comprises receiving additional information indicating a number of KLT coefficients transmitted, and
  wherein the step of estimating KLT basis vectors at the receiver comprises:

calculating an autocorrelation matrix using the KLT coefficients received in the receiving step and initial KLT basis vectors;

solving a generalized eigenvalue problem using the autocorrelation matrix to determine the KLT basis vectors;

finding a scalar measure of the change in the KLT basis vectors from a previously stored value;

repeating the calculating, solving, and finding steps until the scalar measure of change reaches a predetermined threshold; and repeating the previous step a predetermined number of times.

26. The method of claim 17, wherein the step of receiving further comprises receiving additional information indicating the number of KLT coefficients transmitted, and wherein the step of estimating KLT basis vectors at the receiver comprises:

calculating an updated autocorrelation matrix using the KLT coefficients received in the receiving step, a previously stored autocorrelation matrix, and previously stored KLT basis vectors;

updating the previously stored KLT basis vectors by solving a generalized eigenvalue problem using the autocorrelation matrix;

finding a scalar measure of the change in the KLT basis vectors from the previously stored value;

repeating the calculating, solving, and finding steps until the scalar measure of change reaches a predetermined threshold;

repeating the previous step a predetermined number of times; and replacing the previously stored autocorrelation matrix with the updated autocorrelation matrix.

27. A receiver for reconstructing a signal frame using a Karhunen-Loeve transform (KLT), comprising:

an input configured to receive KLT coefficients, without receiving corresponding KLT basis vectors, at the receiver;

an estimator configured to estimate the KLT basis vectors of the signal frame at the receiver; and a signal generator configured to recreate the signal frame from the estimated KLT basis vectors and the received KLT coefficients at the receivers wherein the estimator includes means for calculating an intermediate autocorrelation matrix using the received KLT coefficients, initial KLT basis vectors, initial KLT eigenvalues, and a search direction vector;

means for solving a generalized eigenvalue problem to determine the eigenvectors and eigenvalues of the intermediate autocorrelation matrix; and means for updating the KLT basis vectors using the eigenvectors of the intermediate autocorrelation matrix.

28. A computer readable medium containing program instructions for execution on a computer system, which when executed by the computer system, cause the computer system to perform the steps of:

estimating KLT basis vectors of the signal frame;

calculating KLT coefficients of the signal frame; and transmitting at least one of the KLT coefficients, but not the KLT basis vectors, to a receiver, wherein the step of estimating KLT basis vectors includes calculating an intermediate autocorrelation matrix using the signal frame, initial KLT basis vectors, initial KLT eigenvalues, and a search direction vector:

solving a generalized eigenvalue problem to determine eigenvectors of the intermediate autocorrelation matrix: and updating the KLT basis vectors using the eigenvectors of the intermediate autocorrelation matrix.

29. A computer readable medium containing program instructions for execution on a computer system, which when executed by the computer system, cause the computer system to perform the steps of:

receiving KLT coefficients, without receiving corresponding KLT basis vectors, from a transmitter;

estimating KLT basis vectors; and recreating the signal frame from the estimated KLT basis vectors and the received KLT coefficients, wherein the step of estimating the KLT basis vectors includes calculating an intermediate autocorrelation matrix using the received KLT coefficients, initial KLT basis vectors, initial KLT eigenvalues, and a search direction vector;

solving a generalized eigenvalue problem to determine the eigenvectors and eigenvalues of the intermediate autocorrelation matrix; and updating the KLT basis vectors using the eigenvectors of the intermediate autocorrelation matrix.

* * * * *

UNITED STATES PATENT AND TRADEMARK OFFICE
CERTIFICATE OF CORRECTION

PATENT NO. : 7,103,101 B1
APPLICATION NO. : 09/976053
DATED : September 5, 2006
INVENTOR(S) : Carlos E. Davila It is certified that error appears in the above-identified patent and that said Letters Patent is hereby corrected as shown below:

Column 1, line 26, change " $x(N(n-1))]$." to -- $x(N(n-1))]^T$. --

Column 4, line 31, change " $\Lambda_n$," to -- $\hat{\Lambda}_n$, --

Column 5, line 3, change "In step S216,…" to new paragraph line 11, change " $\vec{v}$ " to -- $\vec{v}_n$ --

Column 6, line 40, change "x," to -- $x_n$ --

Column 7, line 16, change " $\hat{y}_n$." to -- $\bar{y}_n$. --

Column 8, line 5, change " $\bar{Q}_n$ " to -- $\hat{Q}_n$ -- line 21, change " $\epsilon_0(n)$ " to -- $\epsilon^0(n)$ --

Column 9, line 40, change "Equation (8): In step" to -- $Equation(8): H\hat{Q}_n = \hat{Q}_n\hat{\Lambda}_n.$ (8) In step -- line 60, change " $r_{opt}$ " to -- $r_{opt,}$ --

Column 11, line 38, change " $WW^T$ " to -- $ww^T$ --
Column 12, line 52, change "p" to -- P --
Column 13, line 4, change "S11050" to -- S1050 --
      line 15, change "E" to -- $\epsilon$ --
      line 19, change " $\hat{xn}$ " to -- $\hat{x}_n$ --
Column 14, line 63, change "(U:,3);" to -- U(:,3); --
Column 25, line 44, change "receivers" to -- receiver, --

UNITED STATES PATENT AND TRADEMARK OFFICE
CERTIFICATE OF CORRECTION

PATENT NO.        : 7,103,101 B1
APPLICATION NO.   : 09/976053
DATED             : September 5, 2006
INVENTOR(S)       : Carlos E. Davila It is certified that error appears in the above-identified patent and that said Letters Patent is hereby corrected as shown below:

Column 26, line 20, change "vector:" to -- vector;--
line 23, change " matrix:" to -- matrix;--

Signed and Sealed this

Seventeenth Day of July, 2007

JON W. DUDAS
*Director of the United States Patent and Trademark Office*